(12) United States Patent
Aikawa et al.

(10) Patent No.: US 6,703,904 B2
(45) Date of Patent: Mar. 9, 2004

(54) HIGH FREQUENCY OSCILLATOR

(75) Inventors: Masayoshi Aikawa, Saga (JP); Fumio Asamura, Saitama (JP); Takeo Oita, Saitama (JP)

(73) Assignees: Nihon Dempa Kogyo Co., LTD, Toyko (JP); Saga University, Saga (JP)

( * ) Notice: Subject to any disclaimer, the term of this patent is extended or adjusted under 35 U.S.C. 154(b) by 10 days.

(21) Appl. No.: 10/243,617

(22) Filed: Sep. 13, 2002

(65) Prior Publication Data

US 2003/0098746 A1 May 29, 2003

(30) Foreign Application Priority Data

Sep. 14, 2001 (JP) ........................................ 2001-280166
Jul. 12, 2002 (JP) ........................................ 2002-204479
Sep. 9, 2002 (JP) ........................................ 2002-263300

(51) Int. Cl.[7] ................................................ H03B 5/18
(52) U.S. Cl. .................... 331/56; 331/96; 331/108 D; 331/117 D; 331/172; 331/177 V
(58) Field of Search .............................. 331/46, 56, 96, 331/107 SL, 108 D, 117 R, 117 FE, 117 D, 172, 177 V

(56) References Cited

U.S. PATENT DOCUMENTS 4,056,784 A * 11/1977 Cohn ......................... 330/287
4,523,163 A * 6/1985 Houdart et al. ............. 333/218
5,138,284 A    8/1992 Yabuki et al.

FOREIGN PATENT DOCUMENTS

JP         4-175001         6/1992

* cited by examiner

Primary Examiner—David Mis
(74) Attorney, Agent, or Firm—Katten Muchin Zavis Rosenman

(57) ABSTRACT

A high frequency oscillator for combining outputs of two oscillator to generate an oscillation output. The oscillators has a substrate, a slot line formed on a first main plane of the substrate and having both longitudinal ends, the both longitudinal ends being electrically short-circuited, a first and a second amplifier for oscillation, each disposed on one and the other side of the slot line, and having outputs of the same oscillation frequency, and an unbalanced transmission line for connecting input terminals of the first and second amplifiers to each other and for connecting output terminals of the first and second amplifiers to each other. The unbalanced transmission line traverses the slot line and forms a closed loop including the first and second amplifiers.

25 Claims, 18 Drawing Sheets

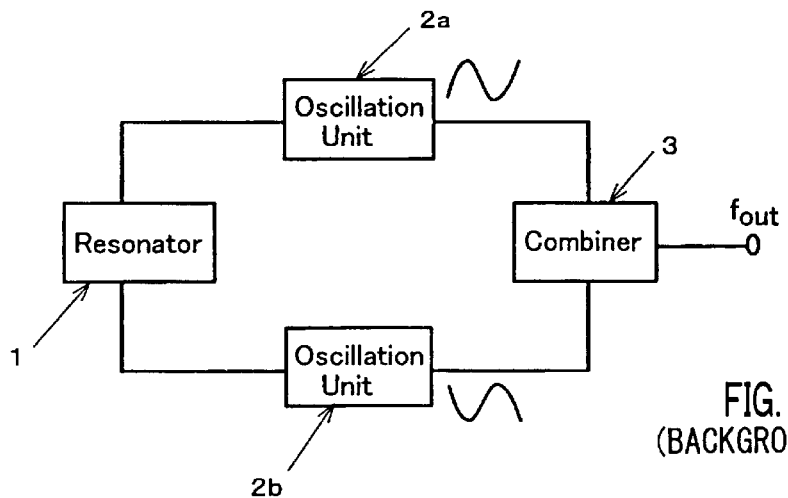
FIG. 1
(BACKGROUND ART)
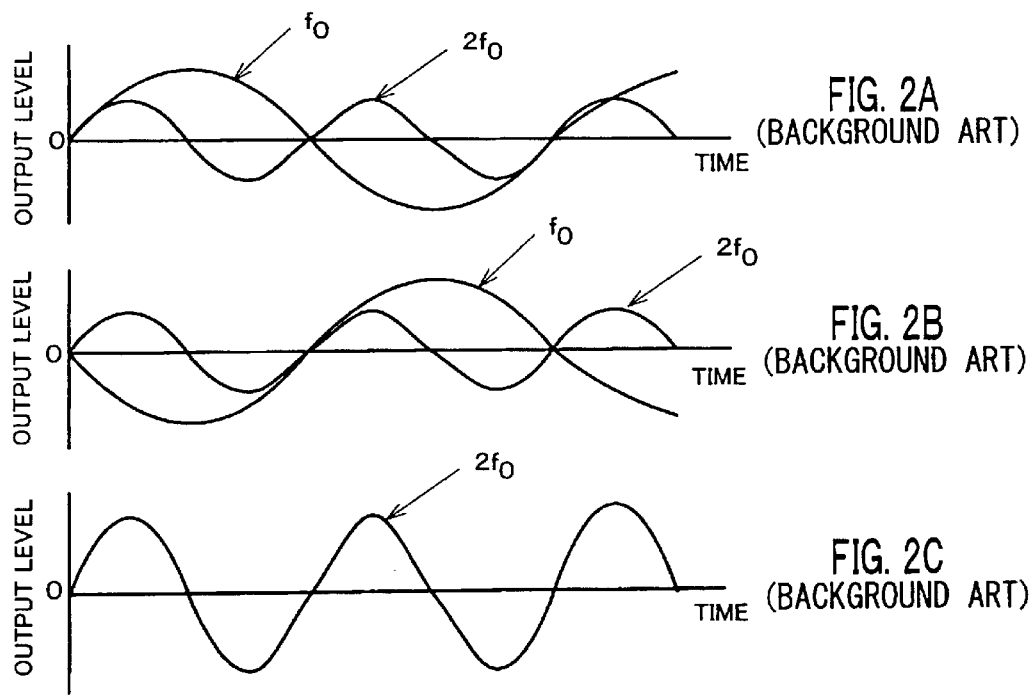
FIG. 2A
(BACKGROUND ART)
FIG. 2B
(BACKGROUND ART)
FIG. 2C
(BACKGROUND ART)

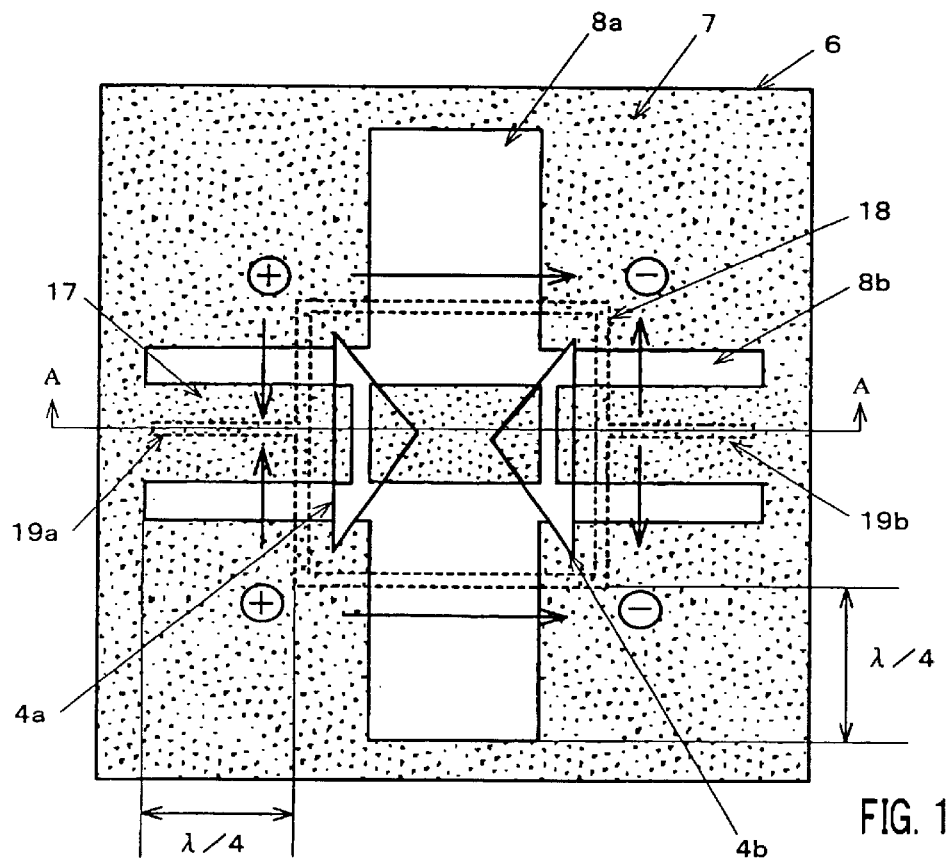
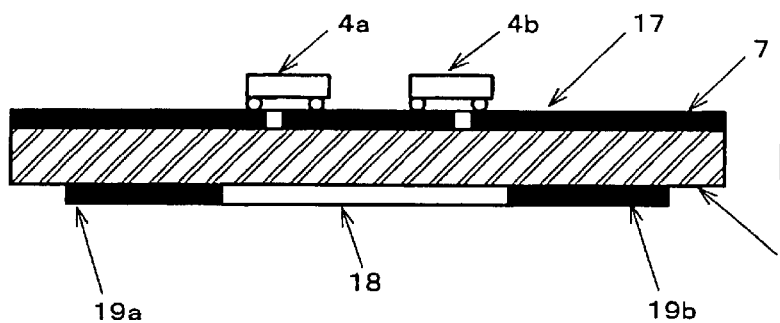
FIG. 13A
FIG. 13B

HIGH FREQUENCY OSCILLATOR

BACKGROUND OF THE INVENTION

1. Field of the Invention

The present invention relates generally to a high frequency oscillator for generating frequencies in millimeter-wave and micro-wave bands, and more particularly, to a high frequency oscillator which uses both a balanced transmission line and an unbalanced transmission line to combine outputs of a first and a second oscillator which oscillate at the same oscillation frequency.

2. Description of the Related Arts

A high frequency oscillator which generally oscillates at frequencies in a range of 1 GHz to 100 GHz is useful, for example, as an oscillation source for a high frequency circuit network associated with optical fibers, or as an oscillation source for measuring devices. As disclosed, for example, in Japanese Patent Laid-open Application No. 4-175001 (JP-A-4-175001), one type of the high frequency oscillator mentioned above is a so-called push-push oscillator which uses two oscillators, each of which oscillates a fundamental wave, and combines outputs of these oscillators to generate a component at a frequency twice as high as that of the fundamental wave. The oscillator which generates a frequency component twice as high as the fundamental wave is hereinafter called the "second harmonics oscillator".

FIG. 1 illustrates the configuration of an example of conventional second harmonics oscillator. The second harmonics oscillator comprises resonator 1, first oscillation unit 2a, second oscillation unit 2b, and combiner 3.

Resonator 1 uses, for example, a dielectric resonator, or LC elements or a micro-strip line built in an IC (integrated Circuit). Oscillator units 2a, 2b each include an amplifier for oscillation, and a feedback system, and share resonator 1 to form a first and a second oscillator, each of which has the same oscillation frequency $f_0$ of a fundamental wave. The respective oscillators are designed such that the fundamental waves delivered therefrom have a phase difference of 180 degrees, i.e., opposite phases to each other. Combiner 3, which may be an in-phase combiner comprising, for example, a differential amplifier, combines outputs of the respective oscillators to supply combined output $f_{out}$ to the outside.

FIGS. 2A to 2C show output waveforms of the output of first oscillation unit 2a, the output of second oscillation unit 2b, and combined output $f_{out}$, respectively. In the circuit illustrated in FIG. 1, fundamental waves $f_0$ delivered from first and second oscillation units 2a, 2b are out of phase by 180 degrees as shown in FIGS. 2A and 2B, so that the fundamental wave components in combined output $f_{out}$ are canceled by each other and removed, as shown in FIG. 2C. On the other hand, first and second oscillation units 2a deliver second harmonic waves ($2f_0$) each having the frequency twice as high as that of fundamental wave $f_0$ are in phase, so that they are combined by combiner 3 which delivers combined output $f_{out}$. Consequently, the circuit illustrated in FIG. 1 cancels and therefore eliminates the fundamental wave and odd-numbered order harmonics of oscillation components from respective oscillation units 2a, 2b. Even-numbered order harmonics from respective oscillation units 2a, 2b are combined so that the respective components have levels twice as high. However, even-numbered order harmonics of fourth or higher have significantly low levels as compared with the second harmonic component, so that second harmonic wave $2f_0$ presents a maximum level in combined output $f_{out}$ delivered from the circuit.

The second harmonics oscillator illustrated in FIG. 1, however, has a problem in a reduction in size, which is difficult to solve because combiner 3 is required for combining the outputs of first and second oscillation units 2a, 2b. Further, since oscillation frequency components, i.e., the fundamental wave components, from first and second oscillation units 2a, 2b, including combiner 3, must be maintained in opposite phase, i.e., with a phase difference of 180 degrees with each other, difficulties are encountered in electrical circuit designing.

SUMMARY OF THE INVENTION

It is an object of the present invention to provide a high frequency oscillator which promotes a reduction in size and facilitates the designing for opposite phase oscillation.

The object of the present invention is achieved by a high frequency oscillator for combining outputs of two oscillators to generate an oscillation output. The oscillator has a substrate, a slot line formed on a first main plane of the substrate and having both longitudinal ends, the both longitudinal ends being electrically short-circuited, a first and a second amplifier for oscillation, each disposed on one or the other side of the slot line, and having outputs of the same oscillation frequency, and an unbalanced transmission line for connecting input terminals of the first and second amplifiers to each other and for connecting output terminals of the first and second amplifiers to each other. The unbalanced transmission line traverses the slot line and forms a closed loop including the first and second amplifiers.

In the present invention, high frequency waves from the output terminals of the first and second amplifiers through the unbalanced transmission line are converted in its propagation mode by the slot line from an unbalanced mode to a balanced mode, and propagate toward one end and the other end of the slot line. In this case, the high frequency waves converted to the balanced mode propagated in opposite phases to each other in both sides of the slot line. The high frequency waves received by the unbalanced transmission line which connects the input terminals of the amplifiers to each other are again converted to the unbalanced mode. Then, the high frequency waves are branched into two from a midpoint of the slot line in the width direction in opposite phases to each other, and fed back to the input terminals of the first and second amplifiers, respectively. Consequently, the first and second amplifiers oscillate in opposite phases to each other, and a first and a second oscillation closed loop in opposite phases to each other are formed. Therefore, assuming that the fundamental wave of oscillation has a frequency $f_0$ in each oscillation closed loop, a second harmonic component ($2f_0$) can be readily generated on the principle of push-push oscillator.

According to the present invention, the high frequency oscillator can be realized in plane circuit configuration without the need for a combiner and the like, thereby contributing to a reduction in size and a simple design for opposite phase oscillation.

BRIEF DESCRIPTION OF THE DRAWINGS

FIG. 1 is a block diagram illustrating the configuration of a conventional second harmonics oscillator;

FIGS. 2A to 2C are waveform charts showing the waveforms of the output of a first oscillation unit, the output of a second oscillation unit, and combined output $f_{out}$, respectively, in the circuit illustrated in FIG. 1;

FIG. 13A a schematic top plan view illustrating a second harmonics oscillator according to an eighth embodiment of the present invention;

FIG. 13B is a cross-sectional view taken along a line A—A in FIG. 13A;

DETAILED DESCRIPTION OF THE INVENTION

Figure 3A:
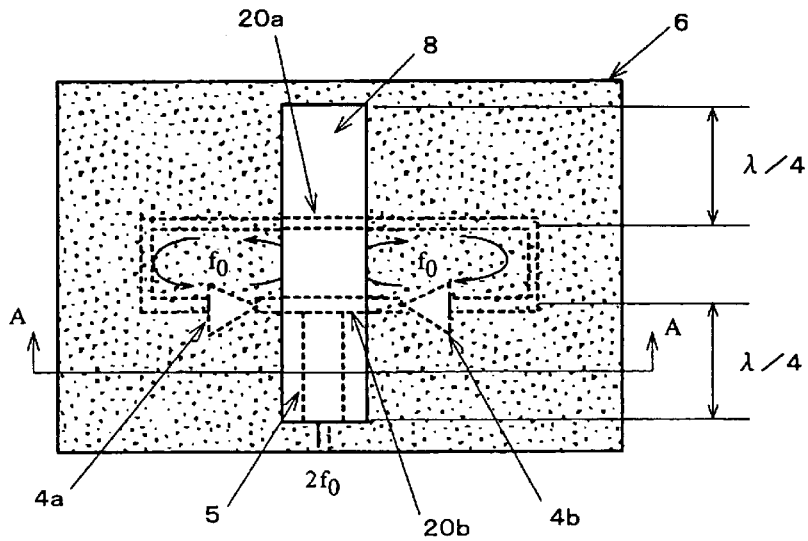
FIGS. 3A and 3B are a schematic top plan view and a schematic back plan view, respectively, illustrating a second harmonics oscillator according to a first embodiment of the present invention.
Figure 3B:
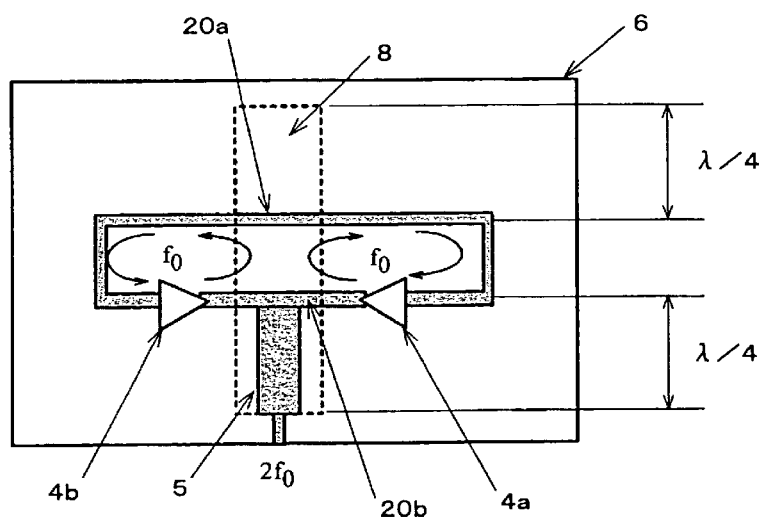
Figure 3C:
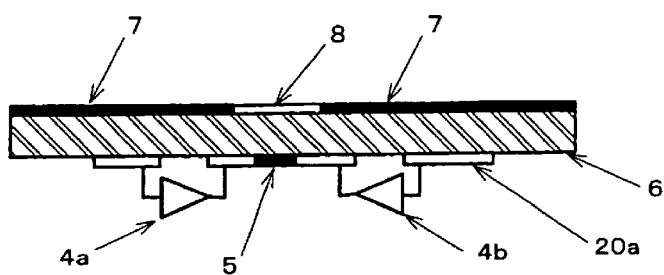
FIG. 3C is a cross-sectional view taken along a line A—A in FIG. 3A.

A second harmonics oscillator (push-push oscillator) according to a first embodiment of the present invention illustrated in FIGS. 3A to 3C comprises substrate 6, slot line 8 which is a balanced transmission line; first amplifier 4a for oscillation; second amplifier 4b for oscillation; an unbalanced transmission line; and output line 5. Substrate 6 is made, for example, of a dielectric material and has metal conductor 7 which is typically a metal plate or metal foil disposed on an approximately entire surface of a first main plane of substrate 6. Slot line 8 is formed by making a strip-shaped aperture in metal conductor 7 disposed on a first main plane of substrate 6, and functions as an aperture line which is electro-magnetically short-circuited at both longitudinal ends. Then, an electric field and a magnetic field associated therewith between portions of metal conductor 7 on both sides of slot line 8 cause high frequency components to propagate along a direction in which slot line 8 extends, toward one and the other ends, i.e., toward the upper and lower ends in FIG. 3A. A propagation mode in this event is a so-called balanced mode and the high frequency components propagate in a slot line mode which generally resembles $TE_{10}$ mode in a rectangular metal waveguide.

First and second amplifiers 4a, 4b are disposed on a second main plane of substrate 6. First and second amplifiers 4a, 4b are placed at positions corresponding to slightly lower sides of a central region of slot line 8 in the longitudinal direction such that their inputs oppose both lateral sides of slot line 8. Amplifiers 4a, 4b are both designed to have outputs of the same oscillation frequency and the same amplitude. It should be noted that FIGS. 3A to 3C omit power supplies and ground lines for amplifiers 4a, 4b for amplification. However, the ground terminals of amplifiers 4a, 4b are connected to metal conductor 7 disposed on the first main plane of substrate 6 through via-holes.

The unbalanced transmission line is formed on the second main plane of substrate 6. The unbalanced transmission line 9 comprises first and second micro-strip lines 20a, 20b which form a closed loop through first and second amplifiers 4a, 4b. First micro-strip line 20a traverses the central region of slot line 8 near one end thereof to connect the inputs of first and second amplifiers 4a, 4b. Second micro-strip line 20b traverses the central region of slot line 8 near the other end thereof to connect the outputs of first and second amplifiers 4a, 4b. Assume herein that the distance between an upper end of slot line 8 as illustrated and first micro-strip line 20a is approximately $\lambda/4$, where $\lambda$ is the wavelength at oscillation frequency (fundamental wave) $f_0$. Likewise, assume that the distance between a lower end of slot line 8 as illustrated and second micro-strip line 20b is also approximately $\lambda/4$. Basically, high frequency components propagate through micro-strip lines 20a, 20b with the aid of an electric field and a magnetic field which is generated by the electric field. The electric field is generated with metal conductor 7 on the first main plane of substrate 6 which acts as a ground conductor. This propagation mode is a so-called unbalanced mode, wherein the high frequency components propagate generally in TEM mode.

Output line 5 is disposed on the second main plane of substrate 6 and connected to second micro-strip line 20b. Then, on the second main plane of substrate 6, output line 5 extends from a position corresponding to slot line 8 and beyond the lower end of slot line 8. Here, the center of output line 5 in the width direction matches the center of second micro-strip line 20b. In addition, output line 5 has a width within slot line 8 larger than a width outside slot line 8 for matching the characteristic impedance.

In the foregoing configuration, high frequency waves in unbalanced mode through the micro-strip line from first and second amplifier 4a, 4b are converted to balanced mode through the slot line because they traverse slot line 8. Then the high frequency waves propagate slot line 8 in the vertical direction as illustrated. Here, since slot line 8 is in balanced mode, high frequency waves propagate between the portions of metal conductor 7 on both sides of slot line 8 due to the electric field in opposite phase.

Thus, the outputs (high frequency waves) in unbalanced mode through second micro-strip line 20b from amplifiers 4a, 4b inevitably propagate in opposite phases to each other when the outputs are converted to the balanced mode by slot line 8 to propagate.

Subsequently, the high frequency propagating through slot line 8 in the vertical direction are again converted to the unbalanced mode by first micro-strip line 20a. In this event, since slot line 8 is a balanced mode transmission line, the high frequency components are branched and fed back to the inputs of respective amplifiers 4a, 4b with the opposite phases to and the same amplitude as each other, viewed from the midpoint of slot line 8 in the width direction. Therefore, slot line 8 basically forms part of respective oscillation closed loops based on first and second amplifiers 4a, 4b, respectively, together with first and second micro-strip lines 20a, 20b, and make the outputs of the first and second amplifier 4a, 4b in opposite phases to each other.

From the foregoing, slot line 8, and first and second micro-strip lines 20, 20b form two oscillation closed loops based on amplifiers 4a, 4b for oscillation, as well as induce the oscillation in two loops in an opposite phase relationship because a portion thereof includes a balanced transmission line (slot line 8) which shares the transmission line. The oscillation frequency (fundamental wave $f_0$) is basically determined by amounts of delays in the two oscillation closed loops, and the phase amplitude characteristics of amplifiers 4a, 4b for oscillation.

As a result, the second harmonics oscillator can combine two oscillation outputs in phase by producing the opposite phase oscillation using the two oscillation closed loops. As such, based on the principles of the push-push oscillator described above, the second harmonics oscillator can draw second harmonic component $2f_0$ at a frequency twice as high as the oscillation frequency (fundamental wave $f_0$) in each oscillation closed loop through output line 5. Specifically, since the outputs of first and second amplifiers 4a, 4b are connected to second micro-strip line 20b, fundamental waves $f_0$ in the outputs are canceled at the midpoint of second micro-strip line 20b so that second harmonic wave $2f_0$ is provided as a combined output. Since slot line 8 positioned beneath output line 5 causes a high characteristic impedance, the line width is increased to make the impedance constant.

The second harmonics oscillator configured as described above only requires output line 5 connected to second micro-strip line 20b and eliminates combiner 3 which would be needed in the conventional second harmonics oscillator, thereby promoting a reduction in size of the oscillator. In addition, the circuit designing is facilitated because slot line 8 can ensure first and second amplifiers 4a, 4b to oscillate in opposite phases.

In the foregoing circuit, since the distances from first and second micro-strip lines 20a, 20b to the upper and lower ends of slot line 8 are chosen to be approximately $\lambda/4$, respectively, where $\lambda$ is the wavelength at the oscillation frequency (fundamental wave $f_0$), the impedances, viewed from first and second micro-strip lines 20a, 20b to the upper and lower ends of slot line 8 are substantially infinite. Therefore, the high frequency component (fundamental wave $f_0$) converted to the balanced mode by slot line 8 propagates between first micro-strip line 20a and second micro-strip line 20b, while frequency components other than the fundamental wave are suppressed to increase a Q value.

However, the distances from the upper and lower ends of slot line 8 to first and second micro-strip lines 20a, 20b need not be $\lambda/4$, respectively. The second harmonics oscillator operates, for example, even if slot line 8 is not formed corresponding to positions outside of first and second micro-strip lines 20a, 20b.

Next, description will be made on a second harmonics oscillator according to a second embodiment of the present invention. In the description on the following embodiments, components identical to those in the first embodiment are designated the same reference numerals, and repetitive description thereon will be omitted.

While the second harmonics oscillator in the first embodiment has the oscillation closed loops for oscillating the second harmonic wave in combination of balanced mode slot line 8 with the unbalanced mode transmission lines (first and second micro-strip lines 20a, 20b) and two amplifiers having opposite phase outputs to each other, such an oscillator basically suffers from a small Q and low stability of the oscillation frequency. To solve this problem, the second embodiment is intended to improve Q by injecting a reference signal from the outside to oscillate in synchronization with the reference signal, thereby improving the stability of frequency.

Figure 4:
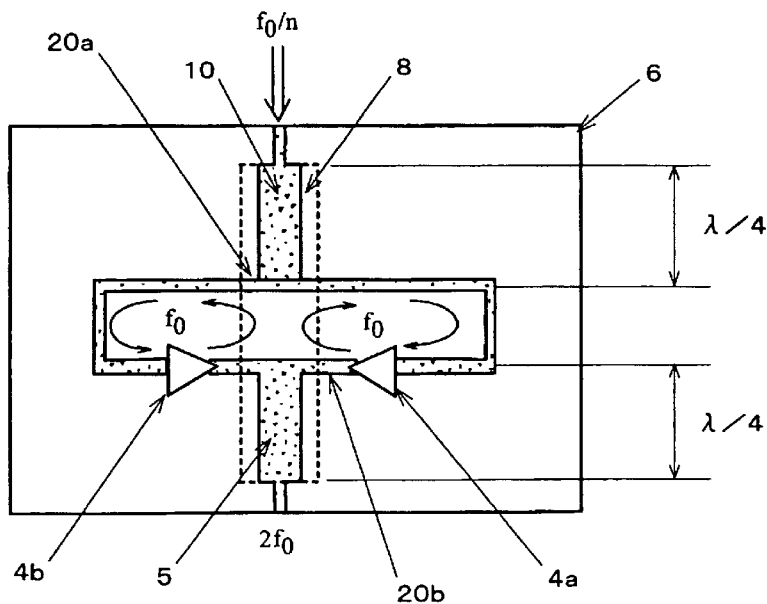
FIG. 4 is a schematic top plan view illustrating a second harmonics oscillator according to a second embodiment of the present invention.

FIG. 4 illustrates the layout of the second harmonics oscillator according to the second embodiment on a second main plane of substrate 6. The second harmonics oscillator additionally comprises injection line 10 for injection synchronization, connected to first micro-strip line 20a which connects the respective inputs of first and second amplifiers 4a, 4b in the second harmonics oscillator in the first embodiment. Injection line 10, which is formed on the second main plane of substrate 6, extends along a position corresponding to slot line 8 and beyond the upper end of slot line 8. Likewise, in the second embodiment, the center of injection line 10 in the width direction matches the midpoint of first micro-strip line 20a, and injection line 10 has a line width larger within slot line 8 than out of slot line 8 for matching the transmission impedance.

Used as a signal for the injection synchronization, i.e., a synchronization signal may be any one of signals from a circuit which has a large Q and high stability. The synchronization signal is one of, for example, an overtone oscillation frequency generated by a quartz oscillator, a multiplied oscillation frequency, or the like. The synchronization signal is at a frequency lower than the oscillation frequency (fundamental wave $f_0$) of the high frequency oscillator by a factor of n (n is an integer). The following description will be made on the assumption that n=2.

Figure 5A:
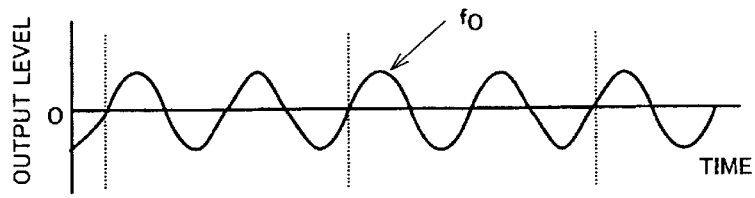
FIGS. 5A to 5C are waveform charts showing waveforms of the output of a first amplifier, the output of a second amplifier, and a synchronization signal, respectively, in the circuit illustrated in FIG. 4.
Figure 5B:
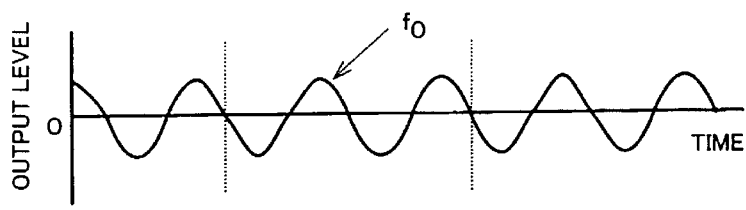
Figure 5C:
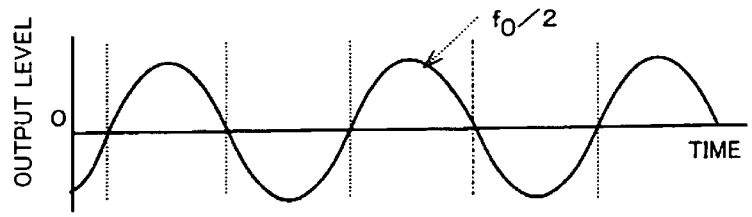

In the circuit configured as described above, the synchronization signal from injection line 10 aligns the phases of high frequency components within oscillation closed loops based on first and second amplifiers 4a, 4b for oscillation. In this event, assuming that the synchronization signal is applied as shown in FIG. 5C, the synchronization signal has the frequency $f_0/2$ half as high as the fundamental wave $f_0$ of the second harmonics oscillator, so that fundamental wave ($f_0$) components are synchronized with each other every two wavelengths $2\lambda$, as shown in FIGS. 5A and 5B, in the first and second oscillation closed loops. Since the outputs of the first and second oscillation closed loops have opposite phases to each other, the fundamental wave components are shifted by the wavelength λ in the synchronization. This stabilizes the fundamental wave $f_0$, with the result that a stable second harmonic component ($2f_0$) is delivered from output line 5.

In the foregoing embodiment, a quartz oscillator is used to generate the synchronization signal at frequency of $f_0/2$ (500 MHz) through overtone oscillation or multiplication, for the fundamental wave $f_0$ (for example, 1 GHZ) of the high frequency oscillator. Alternatively, when the synchronization signal is chosen to have the frequency of $f_0/10$, i.e., 100 MHz, the fundamental wave of the quartz oscillator can be used as the synchronization signal. The latter case eliminates the frequency multiplier circuit and the like, and is therefore suitable for a reduction in size and cost. However, the quartz oscillator can merely generate the synchronization signal at 500 MHz at most, whatever multiple is applied.

Next, description will be made on a second harmonics oscillator according to a third embodiment of the present invention.

The second harmonics oscillators in the foregoing embodiments respectively generate second harmonic waves from a fixed oscillation frequency (fundamental wave $f_0$), whereas the second harmonics oscillator according to the third embodiment employs a variable fundamental wave $f_0$ for oscillation closed loops.

Figure 6:
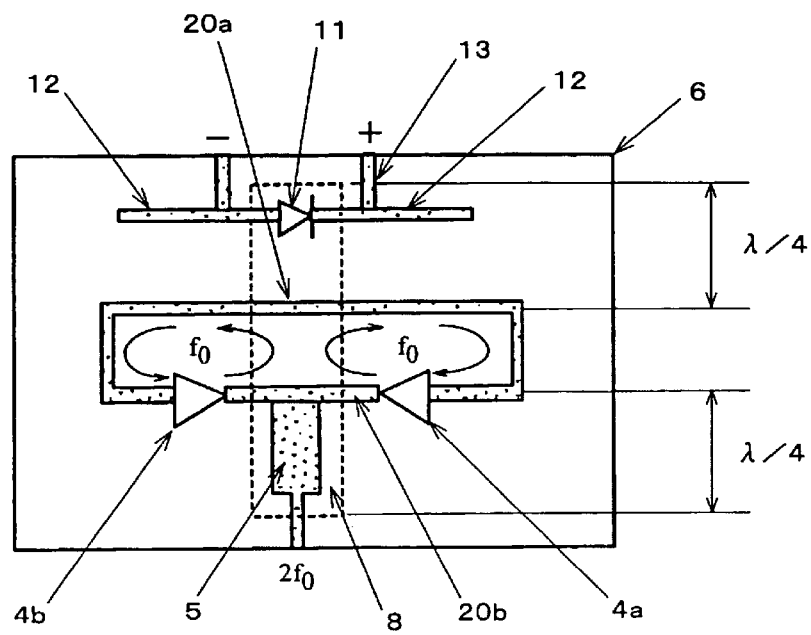
FIG. 6 is a schematic top plan view illustrating a second harmonics oscillator according to a third embodiment of the present invention.

Specifically, as illustrated in FIG. 6, the second harmonics oscillator according to the third embodiment additionally comprises voltage variable capacitance element 11 such as a variable capacitance diode disposed on the second main plane of substrate 6 corresponding to a position within slot line 8, in the second harmonics oscillator according to the first embodiment. Voltage variable capacitance element 11 is placed along the width of slot line 8 between a position corresponding to the upper end of slot line 8 and micro-strip line 20a which connects inputs of first and second amplifiers 4a, 4b. Signal lines 12, extending parallel to first micro-strip line 20a, are connected respectively to both ends of voltage variable capacitance element 11. These signal lines 12 extend onto metal conductor 7 beyond both lateral sides of slot line 8, and a portion carried on metal conductor 7 has a length of approximately λ/4, where λ is the wavelength of the oscillation frequency (fundamental wave $f_0$). A control voltage is applied between both terminals of voltage variable capacitance element 11 in the reverse direction through draw-out lines 13, with the negative polarity at the anode and the positive polarity at the cathode. Draw-out lines 13 may be implemented, for example, as micro-strip lines.

In the foregoing circuit, voltage variable capacitance element 11 is applied with an electric field generated between metal conductor 7 positioned on both sides of slot line 8. Equivalently, therefore, voltage variable capacitance element 11 is connected in parallel to the first and second oscillation closed loops. Voltage variable capacitance element 11 presents a variable capacitance characteristic between its terminals in response to the control voltage applied thereto. As a result, if the capacitance of voltage variable capacitance element 11 is varied by the control voltage, the parallel equivalent capacitance for each oscillation closed loop varies by the same amount, causing the oscillation frequency (fundamental wave $f_0$) to correspondingly change. In other words, since the frequency of fundamental wave $f_0$ can be controlled by the control voltage, the frequency of second harmonic wave $2f_0$ can also be controlled as delivered from output line 5.

Next, description will be made on a second harmonics oscillator according to a fourth embodiment of the present invention.

Figure 7:
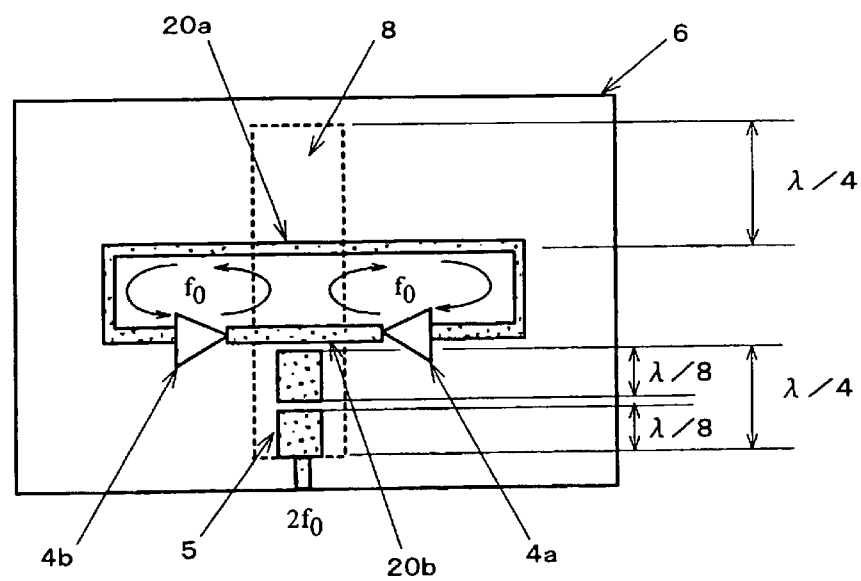
FIG. 7 is a schematic top plan view illustrating a second harmonics oscillator according to a fourth embodiment of the present invention.

In the second harmonics oscillators in the respective embodiments described above, output line 5 is formed over a length of λ/4 at a corresponding position within slot line 8. In the second harmonics oscillator according to the fourth embodiment, on the other hand, output line 5 is divided into two such that each output line has a length of approximately λ/8, as illustrated in FIG. 7. FIG. 7 illustrates the layout on the second main plane of substrate 6. With the illustrated layout, the length of each output line 5, chosen to be λ/8, is equal to one quarter of the wavelength of the second harmonic wave, thereby permitting suppression of frequency components other than the second harmonic component and elimination of unwanted waves. In other words, a portion of output line 5 formed wider in correspondence to slot line 8 functions as a band pass filter which passes the second harmonic component $2f_0$. For example, when the synchronization is established by the injected synchronization signal, as is done in the second embodiment, the synchronization signal from injection line 10 will leak to output line 5 and superimpose on second harmonic wave $2f_0$ as a noise component. By thus dividing output line 5, the noise component can be removed. Divided output lines 5 are electrically connected through electrostatic coupling to output the second harmonic component.

Figure 8:
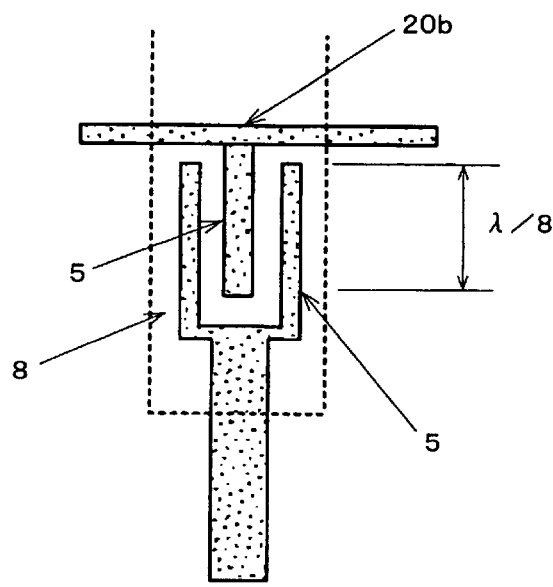
FIG. 8 is a partial plan view illustrating another example of the second harmonics oscillator according to the fourth embodiment.

Alternatively, as illustrated in FIG. 8, output line 5 may be divided in interdigital form to constitute λ/8-coupling lines. In this manner, output lines 5 divided at second harmonic wave $2f_0$ can be more strongly coupled to further reduce a loss.

In the fourth embodiment, output line 5 is arranged so that the output line functions as a band pass filter for passing a frequency twice as high as the oscillation frequency (fundamental wave $f_0$).

Next, description will be made on a high frequency oscillator according to a fifth embodiment of the present invention.

In the foregoing embodiments, the high frequency oscillator is implemented as a second harmonics oscillator, whereas in the fifth embodiment described below, the high frequency oscillator is implemented as a fundamental wave oscillator with an increased output level.

Figure 9:
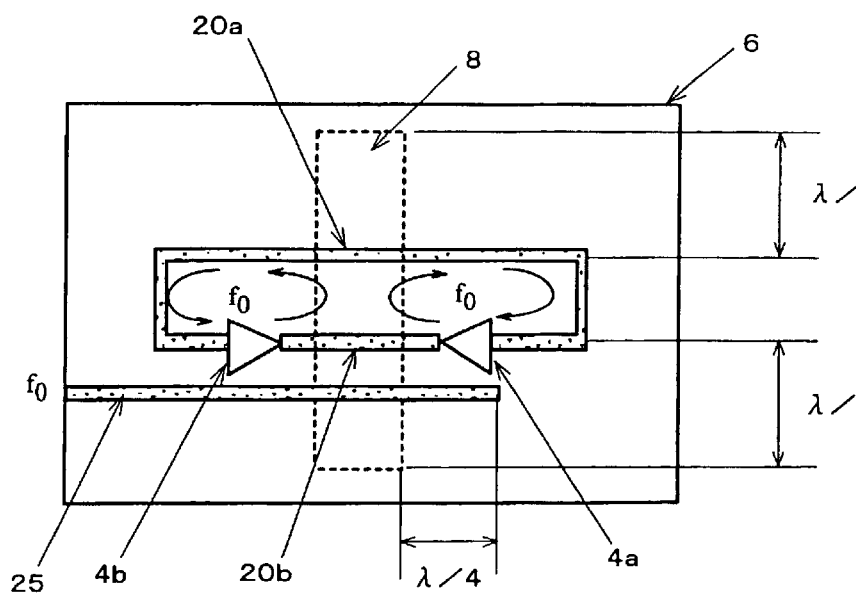
FIG. 9 is a schematic top plan view illustrating a second harmonics oscillator according to a fifth embodiment of the present invention.

As illustrated in FIG. 9, the high frequency oscillator according to the fifth embodiment comprises output line 25 for drawing a fundamental wave component ($f_0$) on the second main plane of substrate 6 instead of the output line for drawing the second harmonic wave in the high frequency oscillator in the first embodiment. FIG. 9 illustrates the layout on the second main plane of substrate 6.

Output line 25 traverses slot line 8 in close proximity to and in parallel with second micro-strip line 20b which connects outputs of first and second amplifiers 4a, 4b. Output line 25 has one end functioning as an output terminal, and the other end extending from a position corresponding to the right end of slot line 8 onto metal conductor 7 by one quarter of the wavelength of the fundamental wave. Output line 25 is implemented as a micro-strip line.

In the circuit described above, respective outputs of amplifiers 4a, 4b for oscillation are converted to a balanced mode by slot line 8, and propagate within slot line 8, in a manner similar to the foregoing. Then, the outputs are converted to an unbalanced mode by first micro-strip line 20a. In this event, since output line 25 on the other end extends from the right end of strip line 8 by one quarter of the wavelength of the fundamental wave, the other end of output line 25 is regarded as short-circuited, in other words, as grounded.

On both sides (left and right sides in FIG. 9) of slot line 8, potentials having opposite phases to each other are generated by amplifiers 4a, 4b. Therefore, a potential at the one end (i.e., the output terminal) of output line 25 is doubled as viewed from the other end (i.e., the grounded end). Thus, the high frequency oscillator of the fifth embodiment combines the outputs of first and second oscillators 4a, 4b, using the fundamental wave $f_0$ as the oscillation frequency, to provide an output at a high level.

In the fifth embodiment, since output line 25 is routed in parallel with second micro-strip line 20b, the impedance, as viewed from second micro-strip line 20b to the lower end of slot line 8, depends on the impedance of second micro-strip line 20b, and is, for example, 50 Ω. Even in this case, however, the transmission efficiency or conversion efficiency on output line 25 can be increased by choosing the distance from second micro-strip line 20b to the lower end of slot line 8 to be $\lambda/4$.

Next, description will be made on a second harmonics oscillator according to a sixth embodiment of the present invention. The respective embodiments described above use first and second micro-strip lines 20a, 20b as an unbalanced transmission line, whereas the sixth embodiment uses coplanar lines instead of the micro-strip lines.

Figure 10A:
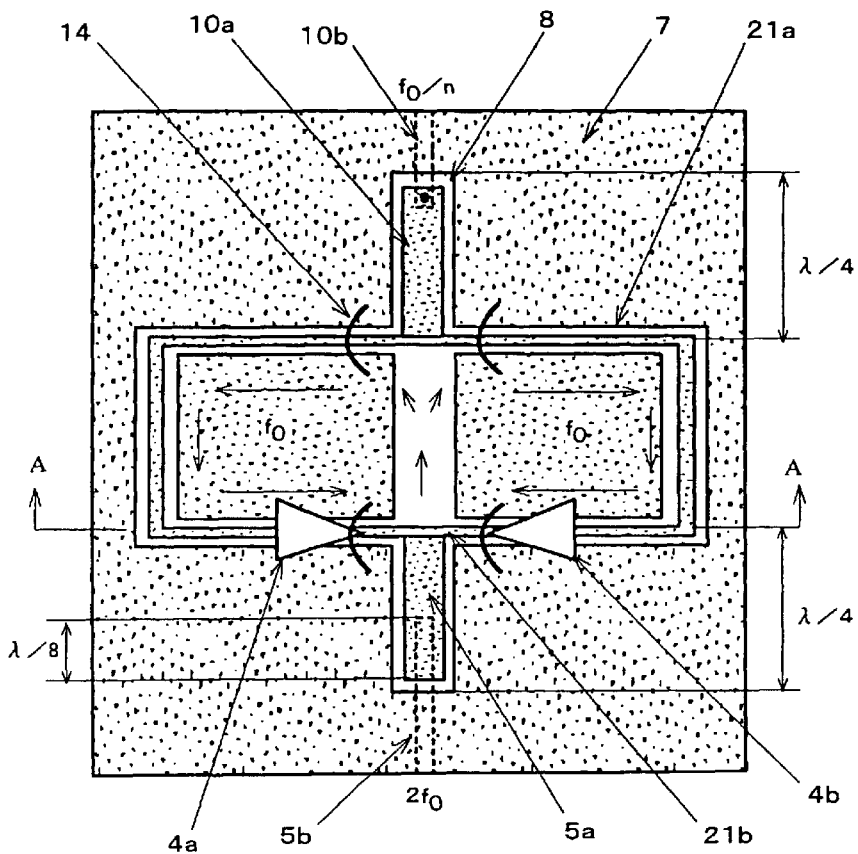
FIG. 10A is a schematic top plan view illustrating a second harmonics oscillator according to a sixth embodiment of the present invention.
Figure 10B:
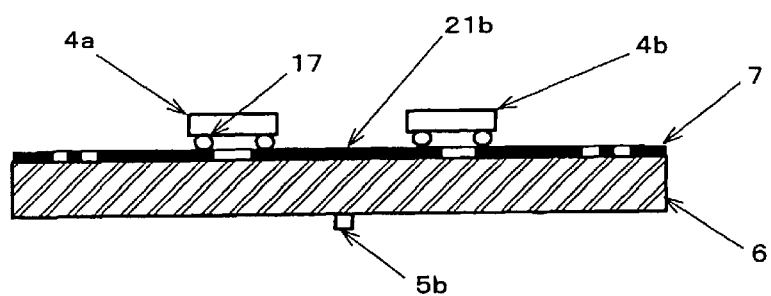
FIG. 10B is a cross-sectional view taken along a line A—A in FIG. 10A.

The second harmonics oscillator according to the sixth embodiment illustrated in FIGS. 10A and 10B comprises metal conductor 7 on the first main plane of substrate 6. Substrate 6 is made of a dielectric material or the like and metal conductor 7 is disposed on an approximately entire surface of the first main plane of substrate 6. Metal conductor 7 is typically made of a metal plate or metal foil. A strip-shaped aperture is formed in metal conductor 7 to form slot line 8. Further, first and second amplifiers 4a, 4b for oscillation, and first and second coplanar lines 21a, 21b are formed on the first main plane of substrate 6. First and second amplifiers 4a, 4b for oscillation are disposed on both sides of slot line 8, and first coplanar line 21a connects inputs of amplifiers 4a, 4b to each other, while second coplanar line 21b connects outputs of amplifiers 4a, 4b to each other. With these components thus connected, an unbalanced transmission line comprised of coplanar lines 21a, 21b forms a closed loop. The formation position of coplanar lines 21a, 21b on the first main plane of substrate 6 corresponds to that of micro-strip lines 201, 20b on the second main plane of substrate 6 in the respective embodiments described above.

Coplanar lines 21a, 21b centrally have signal lines between metal conductors 7 on both sides such that a gap is formed therebetween. Each of coplanar lines 21a, 21b has an intersection with slot line 8 and the signal line of each coplanar line is continuously formed at the intersection so that it traverse slot line 8. Coplanar lines 21a, 21b form an unbalanced transmission line through an electric field generated between the signal line and metal conductor 7 and a magnetic field associated with the electric field to propagate high frequency components therethrough. Here, metal conductors 7 positioned on both sides of the signal lines of the coplanar lines 21a, 21b are connected at the same potential through an air bridge 14 made of a conductor. Amplifiers 4a, 4b in turn are connected directly to coplanar lines 21a, 21b using, for example, bumps 17. Of course, the bump-based connection can be used for connecting the amplifiers to the micro-strip lines in the respective embodiments described above.

In the circuit configured as described above, the propagation mode of high frequency waves from first and second amplifiers 4a, 4b is converted from the unbalanced mode to the balanced mode by slot line 8 through second coplanar line 21b which connects the outputs of these amplifiers, in a manner similar to the respective embodiments described above. Then, they are converted from the balanced mode to the unbalanced mode again by first coplanar line 21a which connects the inputs of amplifiers 4a, 4b. Consequently, first and second amplifiers 4a, 4b form a first and a second oscillation closed loop together with slot line 8 and coplanar lines 21a, 21b.

The oscillation frequency (fundamental wave $f_0$) generated by the first and second oscillation closed loops is determined by the lengths of first and second coplanar lines 21a, 21b and slot line 8, as well as by amplifiers 4a, 4b, as is the case with the respective embodiments described above. The distance from first coplanar line 21a to the upper end of slot line 8 is set to $\lambda/4$, where $\lambda$ is the wavelength of the fundamental wave $f_0$, and the distance from the second coplanar line 21b to the lower end of slot line 8 is similarly set to $\lambda/4$. With these settings, the oscillation closed loops generates a complete standing wave of the fundamental wave to increase the Q.

Second coplanar line 21b, which connects the respective outputs of first and second amplifiers 4a, 4b, cancels the fundamental wave components ($f_0$), and combines second harmonic components ($2f_0$) at a level twice as high.

Slot line 8 is provided therein first output line 5a which is formed as coplanar line connected to second coplanar line 21b and extending downward in FIG. 10A. Second output line 5b is routed on the second main plane of substrate 6 to overlap with first output line 5a across substrate 6 by a length of $\lambda/8$, i.e., by one quarter of the wavelength of the second harmonic wave. These first and second output lines 5a, 5b permit the second harmonic wave to be drawn therethrough. Second output line 5b is substantially implemented as a micro-strip line which is grounded through metal conductor 7 on the first main plane of substrate 6.

Further, in this configuration, slot line 8 may be provided therein with first injection line 10a such that it is connected to first coplanar line 21a which connects the respective inputs of first and second amplifiers 4a, 4b. First injection line 10a functions as a coplanar line for injection synchronization. A synchronization signal from a quartz oscillator or the like is applied through first injection line 10a to synchronize the phase of fundamental wave $f_0$ to the synchronization signal to increase Q of the second harmonics oscillator. In this embodiment, second injection line 10b, which functions as a micro-strip line for connection with a synchronization signal source, is routed on the second main plane of substrate 6, and second injection line 10b is connected to first injection line 10a through a via-hole, i.e., an electrode through-hole.

This second harmonics oscillator can reduce a degradation in characteristics due to unmatched impedance in the via-hole and the like, since the synchronization signal injected thereto has a low frequency. Alternatively, first injection line 10a may be routed to overlap second injection line 10b across substrate 6, instead of the-via hole.

The second harmonics oscillator in the sixth embodiment can control the oscillation frequency, similarly to the third embodiment, by the action of the voltage variable capacitance element disposed in slot line 8.

Such a second harmonics oscillator still eliminates a combiner and facilitates the designing for opposite phase oscillation as is the case with the second harmonics oscillator which uses a micro-strip line for an unbalanced transmission line. In addition, since the circuit in the sixth embodiment comprises slot line 8 and coplanar lines 21a, 21b on the first main plane of substrate 6, no grounded conductor for a ground plane is required on the second main plane of substrate 8. This facilitates the designing of the circuit since the grounding point for amplifiers 4a, 4b for oscillation can be provided on the first main plane of substrate 6. Even with the use of coplanar lines, fundamental wave $f_0$ can be generated to double the output level, as is the case with the fifth embodiment.

Next, description will be made on a second harmonics oscillator according to a seventh embodiment of the present invention. The first to fifth embodiments use micro-strip lines to form an unbalanced transmission line in a loop manner for connection between the amplifiers, and the sixth embodiment uses coplanar lines for the unbalanced transmission line, whereas the seventh embodiment forms an unbalanced transmission line for connection between the amplifiers in combination of a micro-strip line with coplanar lines.

Figure 11A:
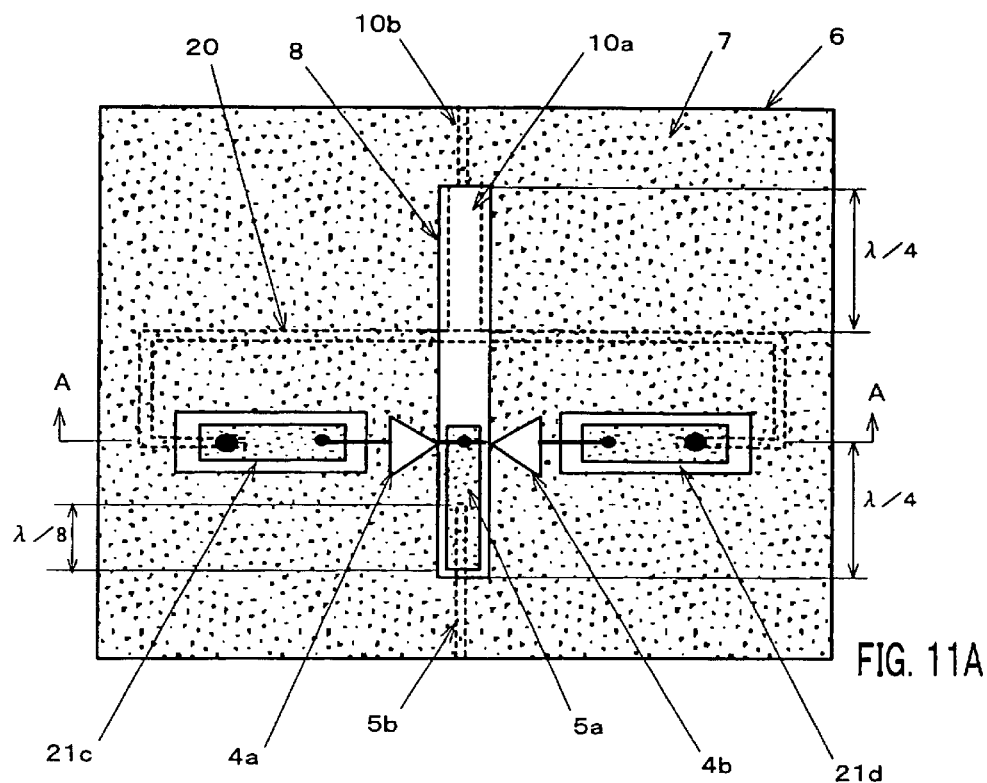
FIG. 11A is a schematic top plan view illustrating a second harmonics oscillator according to a seventh embodiment of the present invention.
Figure 11B:
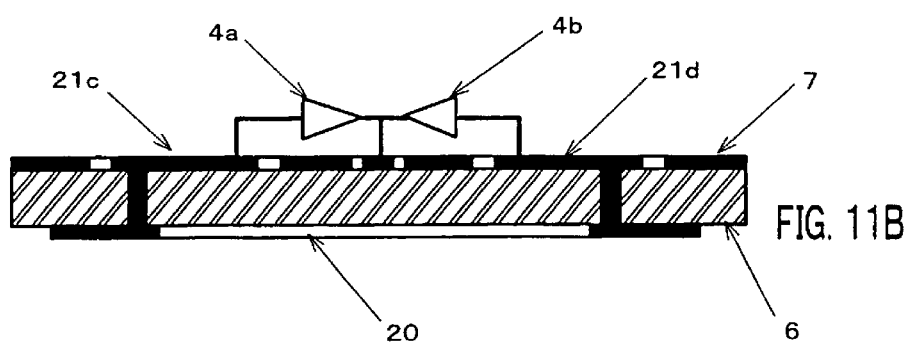
FIG. 11B is a cross-sectional view taken along a line A—A in FIG. 11A.

The second harmonics oscillator according to the seventh embodiment illustrated in FIGS. 11A and 11B comprises metal conductor 7 on a first main plane of substrate 6 made of a dielectric material or the like, and slot line 8 formed as an aperture extending on metal conductor 7. Metal conductor is typically made of a metal plate or metal foil and disposed on an approximately entire surface of the first main plane of substrate 6. Also, on the first main plane of substrate 6, first and second amplifiers 4a, 4b for oscillation are disposed on both sides of slot line 8. The inputs of amplifiers 4a, 4b are connected to each other through micro-strip line 20 and coplanar lines 21a, 21b. Micro-strip line 20 routed on a second main plane of substrate 6 traverses slot line 8 formed on the first main plane of substrate 6 at a position closer to the upper end of slot line 8 from the center of the same in a direction perpendicular to the longitudinal direction of slot line 8. Micro-strip line 20 is folded back at both ends thereof, and is connected to coplanar lines 21a, 21b routed on the main plane of substrate 6 through via-holes.

Coplanar lines 21a, 21b are connected to the inputs of first and second amplifiers 4a, 4b, respectively. Output terminals of amplifiers 4a, 4b are connected to each other, with its midpoint connected to first output line 5a routed within slot line 8. First output line 5a has a length of approximately $\lambda/4$, where $\lambda$ is the wavelength of fundamental wave $f_0$, and is formed as a coplanar line. Then, first output line 5a is electro-magnetically coupled to second output line 5b formed on the second main plane of substrate 6 through substrate 6. Coplanar lines 21a, 21b are connected to the inputs of amplifiers 4a, 4b, respectively, through conductors including bumps and the like. The connection of the outputs of amplifiers 4a, 4b to each other, as well as the connection of the midpoint to first output line 5a are also made through conductors including bumps and the like.

In conclusion, the second harmonics oscillator according to the seventh embodiments comprises an overhead wiring instead of second coplanar line 20b in the sixth embodiment. A portion of first coplanar line 20a in the sixth embodiment is left as coplanar lines 20c, 20d and micro-strip line 20 is substituted for the removed portion of first coplanar line 20a.

In the foregoing circuit, since the potentials in opposite phases to each other are generated and propagate at both sides of slot line 8 which is a balance mode transmission line the outputs of first and second amplifiers 4a, 4b are in opposite phase to each other. Since first output line 5a is formed in a portion below slot line 8 as illustrated in FIG. 11A, it may be said that the high frequency components of fundamental wave $f_0$ propagate in an even mode which are orthogonal to the coplanar line mode in which a potential direction is aligned with the same direction as a signal line of a potential at a midpoint of first output line 5a.

Likewise, in the configuration as described above, fundamental wave ($f_0$) components are canceled at the midpoint of first output line 5a, and the second harmonic wave components ($2f_0$) are combined there. As appreciated, the second harmonics oscillator thus configured eliminates a combiner, contributing to simple designing for opposite phase oscillation. Further, the coplanar structure eliminates the need for a ground conductor (ground plane) on the second main plane of substrate 6, thereby permitting easy connections of amplifiers 4a, 4b for oscillation.

In the second harmonics oscillator according to the seventh embodiment, a synchronization signal can be injected therein, in a manner similar to the second embodiments and the like. For injecting the synchronization signal, first injection line 10a is connected to micro-strip line 20 on the second main plane of substrate 6, and one end of second injection line 10b is connected to first injection line 10a. First injection line 10a, routed at a position corresponding to slot line 8, has a length of approximately $\lambda/4$, and a width larger than second injection line 10b for impedance matching. The synchronization signal may be supplied from the other end of second signal line 10b.

Figure 12:
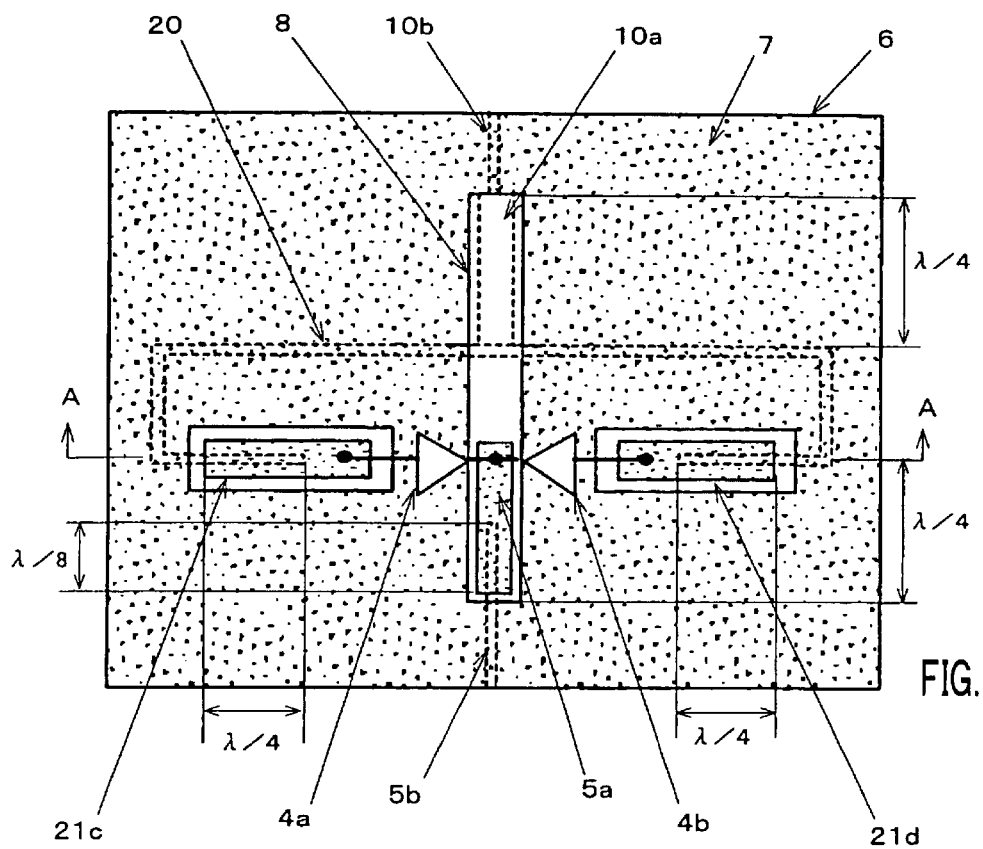
FIG. 12 is a schematic top plan view illustrating another example of the second harmonics oscillator according to the seventh embodiment.

While in the foregoing description, micro-strip line 20 is connected to coplanar lines 21a, 21b through via-holes, the via-holes may not be used. In this case, as illustrated in FIG. 12, both ends of micro-strip line 20 may be overlapped with coplanar lines 21a, 21b by a length of approximately $\lambda/4$ across substrate 6. In this manner, both ends of micro-strip line 20 are virtually electrically short-circuited and electro-magnetically coupled to coplanar lines 21a, 21b. The electro-magnetic coupling permits a coplanar structure without any via-hole, so that the resulting second harmonics oscillator can reduce a transmission loss. However, since the second harmonics oscillator tends to have a longer line relative to the wavelength, this structure is suitable for ultrahigh frequency waves.

Next, description will be made on a second harmonics oscillator according to an eighth embodiment of the present invention. While each of the foregoing embodiments has illustrated an exemplary second harmonics oscillator which comprises a slot line that extends only in one direction (vertical direction in each figure), the second harmonics oscillator according to the eighth embodiment comprises two slot lines which intersect each other.

The second harmonics oscillator according to the eighth embodiment illustrated in FIGS. 13A and 13B comprises metal conductor 7 on the first main plane of substrate 6 which is made of a dielectric material or the like. This metal conductor 7 is typically made of a metal plate or metal foil disposed on an approximately entire surface of the first main plane of substrate 6 and formed with first slot line 8a extending in the vertical direction in FIG. 13A, and a second slot line 8b extending in a direction perpendicular to first slot line 8a, that is, in the horizontal direction in FIG. 13A, at the center thereof. Both slot lines 8a, 8b are formed as strip-shaped apertures.

Within the slot of second slot line 8a, a signal line 17 is formed as extending to the left and to the right in FIG. 13A so that its left and right ends are connected to metal conductor 7 which surrounds slot lines 8a, 8b. Signal line 17 is cut at positions corresponding to both lateral sides of first slot line 8a, respectively. In other words, signal line 17 is provided as a coplanar line which perpendicularly intersects first slot line 8a at the center, and are short-circuited at both ends.

On the first main plane of substrate 6, first and second amplifiers 4a, 4b for oscillation are disposed at positions on both lateral sides of first slot line 8a. Output terminals of amplifiers 4a, 4b are connected to a portion of signal line 17 which is isolated within first slot line 8a. An input terminal of amplifier 4a is connected to a portion of signal line 17 which is connected to a left end of second slot line 8b, while an input terminal of amplifier 4b is connected to a portion of signal line 17 which is connected to a right end of second slot line 8b.

Substrate 6 is formed, on the second main plane, with micro-strip line 18 in the shape of a rectangular frame which surrounds the intersection of first and second slot lines 8a, 8b as well as first and second amplifiers 4a, 4b, and forms a loop by traversing slot lines 8a, 8b in the horizontal and vertical directions, respectively.

Micro-strip line 18 traverses first slot line 8a at two positions, i.e., an upper and a lower position as illustrated. The distance from the position traversed by micro-strip line 18 to the upper or lower end of first slot line 8a is chosen to be approximately $\lambda/4$. As a result, the upper and lower ends of first slot line 8a are virtually electrically opened, when viewed from the position at which micro-strip line 18 traverses first slot line 8a. Micro-strip line 18 also traverses second slot line 8b at two positions, i.e., a left and a right position as illustrated. The distance from the position traversed by micro-strip line 18 to the left or right end of second slot line 8b is also chosen to be approximately $\lambda/4$. Lines 19a, 19b each having a length of approximately $\lambda/4$ are connected to micro-strip line 18 at midpoints of portions of micro-strip line 18 which traverse second slot line 8b. Lines 19a, 19b extend to the left and right from the joints to the portions of micro-strip line 18. Lines 19a, 19b each have a micro-strip line structure. Because of their lengths being $\lambda/4$, lines 19a, 19b appear to be virtually electrically short-circuited to metal conductor 7, when viewed from micro-strip line 18, though they are open lines.

In the foregoing circuit, outputs from first and second amplifiers 4a, 4b are converted to a balanced mode at first slot line 8a through centrally located signal line 17. Then, assuming for example that the left side of slot line 8a is at a positive potential and the right side of the same is in an opposite phase of the left side, i.e., at a negative potential, an electric field generated around first slot line 8a directs from left to right, as indicated by allows, as is similar to the case with the aforementioned embodiments. Therefore, in second slot line 8b which forms a coplanar line, assuming that signal line 17 is defined as a reference potential, an electric field is generated in the vertical direction toward signal line 17 in a region to the left of first slot line 8a, while an electric field is generated in the vertical direction from signal line 17 in a region to the right of first slot line 8a. Thus, on the left and right sides of second slot line 8b, high frequency components having opposite phases to each other propagate in an unbalanced mode (odd mode, that is, coplanar line mode) by the action of the electric fields in the opposite directions with signal line 17 defined as a reference potential.

From the foregoing, the high frequency waves in balanced mode, which propagate through first slot line 8a in the vertical direction, are converted to the unbalanced mode in opposite phases to each other, when viewed from the midpoint of the first slot line 8a in the width direction, by micro-strip line 18 which traverses first slot line 8a at two positions, and branched into two which propagate to the left and right, respectively. Then, the high frequency waves flow into lines 19a, 19b which short-circuit micro-strip line 18. Thus, the two branched high frequency components in opposite phases on the left and right signal lines 19a, 19b are converted from the unbalanced mode of micro-strip line 18 to the unbalanced mode by second slot line 8b having signal line 17, i.e., the coplanar line. Consequently, the high frequency components are fed to first and second amplifiers 4a, 4b.

Thus, first and second amplifiers 4a, 4b form two, i.e., left and right oscillation closed loops which pass through first slot line 8a having electrically opened upper and lower ends; micro-strip line 18 including lines 19a, 19b; and second slot line 8b having signal line 17 having short-circuited left and right ends. Here, first slot line 8a implements a balanced mode transmission line, while micro-strip line 18 including lines 19a, 19b, and second slot line 8 including signal line 17 implement an unbalanced transmission line.

In the foregoing circuit, the high frequency components propagate by the action of an electric field between left and right signal lines 17 and metal conductor (ground plane) 7 positioned above and below signal lines 17 as illustrated, so that it can be said that a total of four oscillation closed loops are formed in an upper left portion, an upper right portion, a lower left portion, and an upper left portion in FIG. 13A, wherein the oscillation closed loops in the upper left and lower left portions oscillate in phase, and oscillation closed loops in the upper right and lower right portions oscillate in phase as well.

Figure 14:
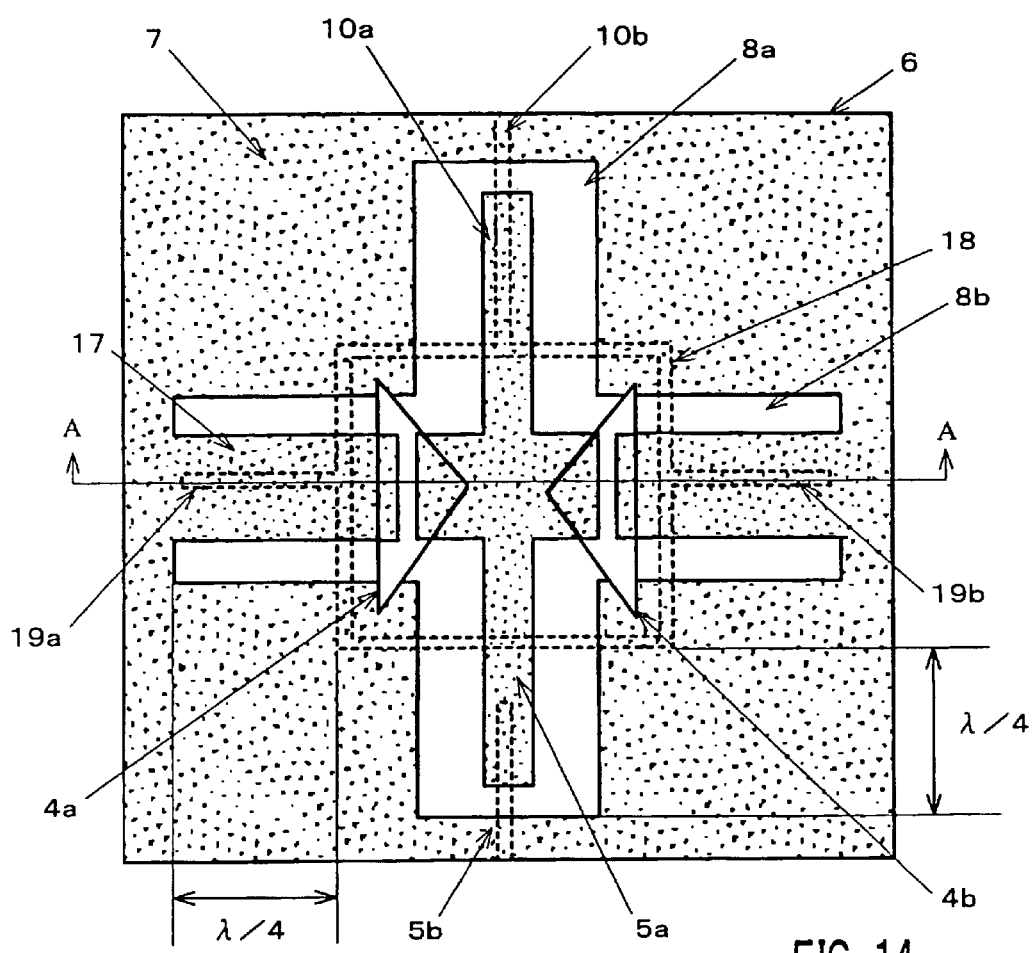
FIGS. 14 to 16 are schematic top plan views respectively illustrating other examples of the second harmonics oscillator according to the eighth embodiment.

Bearing this in mind, the second harmonics oscillator is additionally provided with signal line 5a, in first slot line 8a, which extends downward in FIG. 14 from a portion of signal line 17 to which the output terminals of first and second amplifiers 4a, 4b are connected, and with signal line 5b on the second main plane of substrate 6 as a micro-strip line such that it partially overlaps output line 5a, as illustrated in FIG. 14, thereby canceling the fundamental wave components ($f_O$) and provide a combined second harmonic component ($2f_O$). In addition, the second harmonics oscillator is provided with injection line 10a which extends upward in FIG. 14 from the portion of signal line 17 to which the output terminals of first and second amplifiers 4a, 4b are connected, and further with injection line 10b on the second main plane of substrate 7 as a micro-strip line such that it partially overlaps injection line 10a, whereby a synchronization signal can be injected into the second harmonics oscillator to more stably oscillate second harmonic wave $2f_O$ at the oscillation frequency. Injection line 10b is provided in micro-strip line structure.

Figure 15:
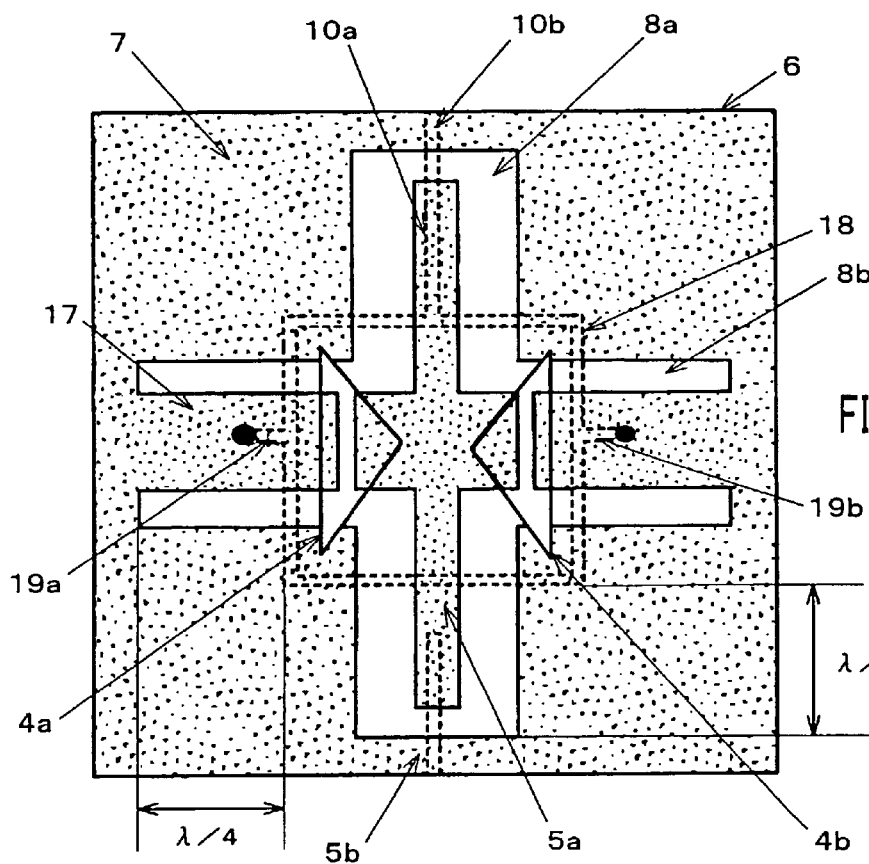
Figure 16:
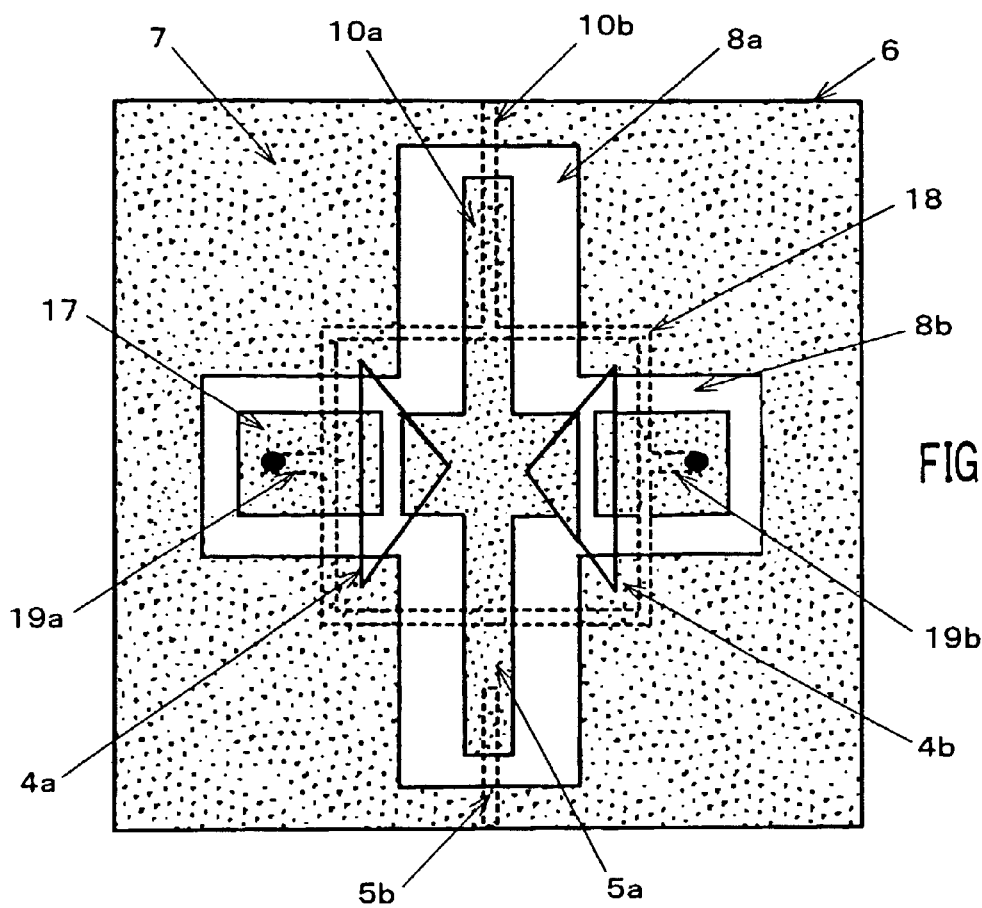

In the circuit illustrated in FIGS. 13 and 14, lines 19a, 19b connected to micro-strip line 18 are implemented by micro-strip lines each having a length of $\lambda/4$. Alternatively, for example, as illustrated in FIG. 15, lines 19a, 19b may be reduced in length, and instead connected to signal line 17 through via-holes. In this case, as illustrated in FIG. 16, when signal line 17 is reduced in length and opened at both ends, a high impedance circuit can be designed. In the circuit illustrated in FIG. 16, second slot line 2b is also reduced in length commensurate with the reduced length of signal line 17.

Figure 17A:
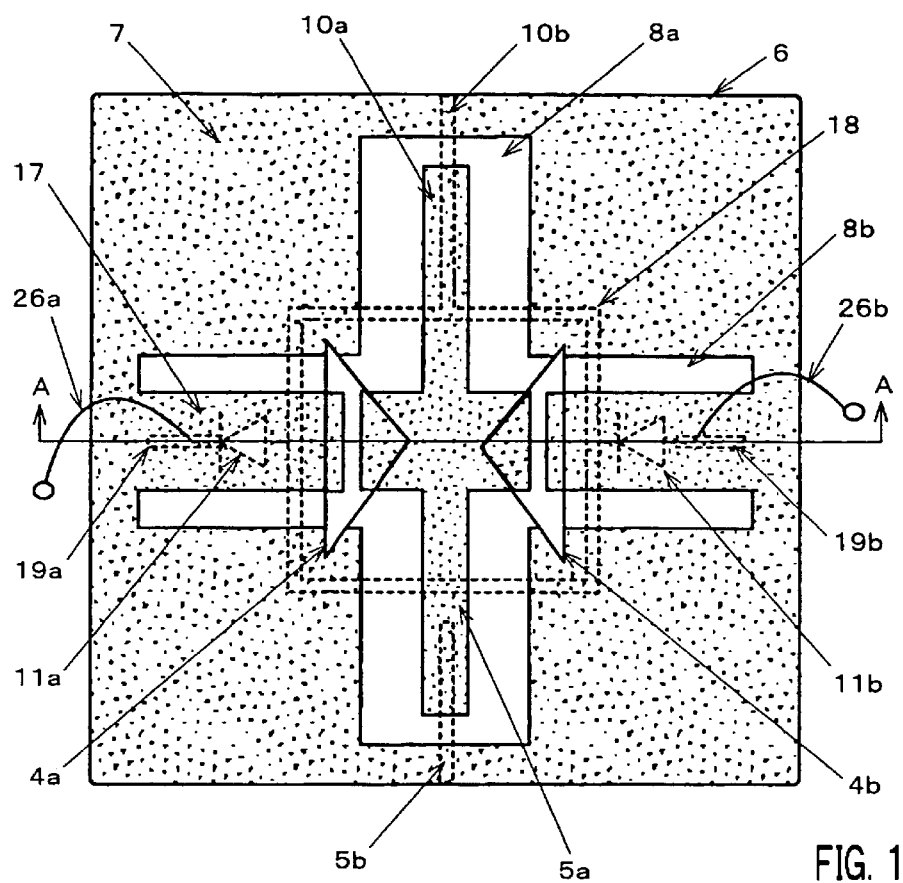
FIG. 17A a schematic top plan view illustrating a second harmonics oscillator according to a ninth embodiment of the present invention.
Figure 17B:
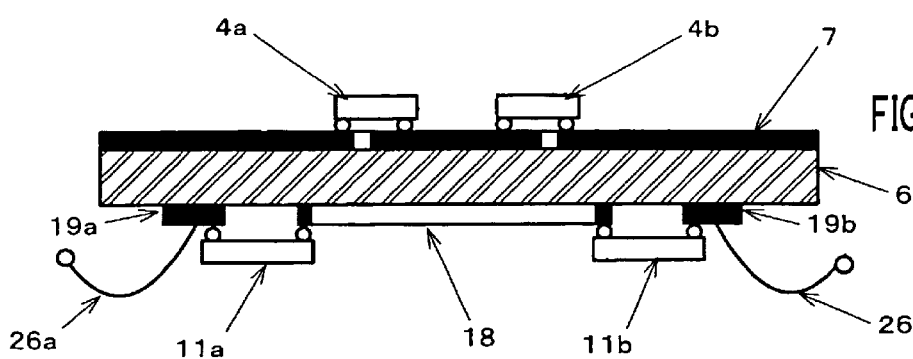
FIG. 17B is a cross-sectional view taken along a line A—A in FIG. 17A.

Next, description will be made on a second harmonics oscillator according to a ninth embodiment of the present invention. The second harmonics oscillator according to the ninth embodiment illustrated in FIGS. 17A and 17B adds voltage variable capacitance elements to the second harmonics oscillator illustrated in FIG. 14 to create a frequency variable oscillator. More specifically, in the oscillator illustrated in FIG. 14, instead of directly connecting lines 19a, 19b to micro-strip line 18, lines 19a, 19b are connected to micro-strip line 18 through voltage variable capacitance elements 11a, 11b such as variable capacitance diodes. In this event, voltage variable capacitance elements 11a, 11b are arranged on the second main plane of substrate 6 such that voltage variable capacitance elements 11a, 11b have the polarities in the same directions, for example, have their anodes on the right side and their cathodes on the left side in FIG. 14. Further, lead wires 26a, 26b are connected to lines 19a, 19b for applying a control voltage to voltage variable capacitance elements 11a, 11b.

In the foregoing circuit, since voltage variable capacitance elements 11a, 11b are connected between micro-strip line 18 and signal lines 19a, 19b, respectively, they are equivalently inserted in parallel to the oscillation closed loops. It is therefore possible to vary parallel equivalent capacitances, in other words, electrical lengths of the oscillation closed loops by applying the control voltage such that voltage variable capacitance element 19a has the positive polarity at the cathode and voltage variable capacitance element 19b has the negative polarity at the anode, thereby varying the oscillation frequency of fundamental wave $f_0$. This also causes variations in the oscillation frequency of the second harmonic wave $2f_0$ which is the combined output.

Figure 18:
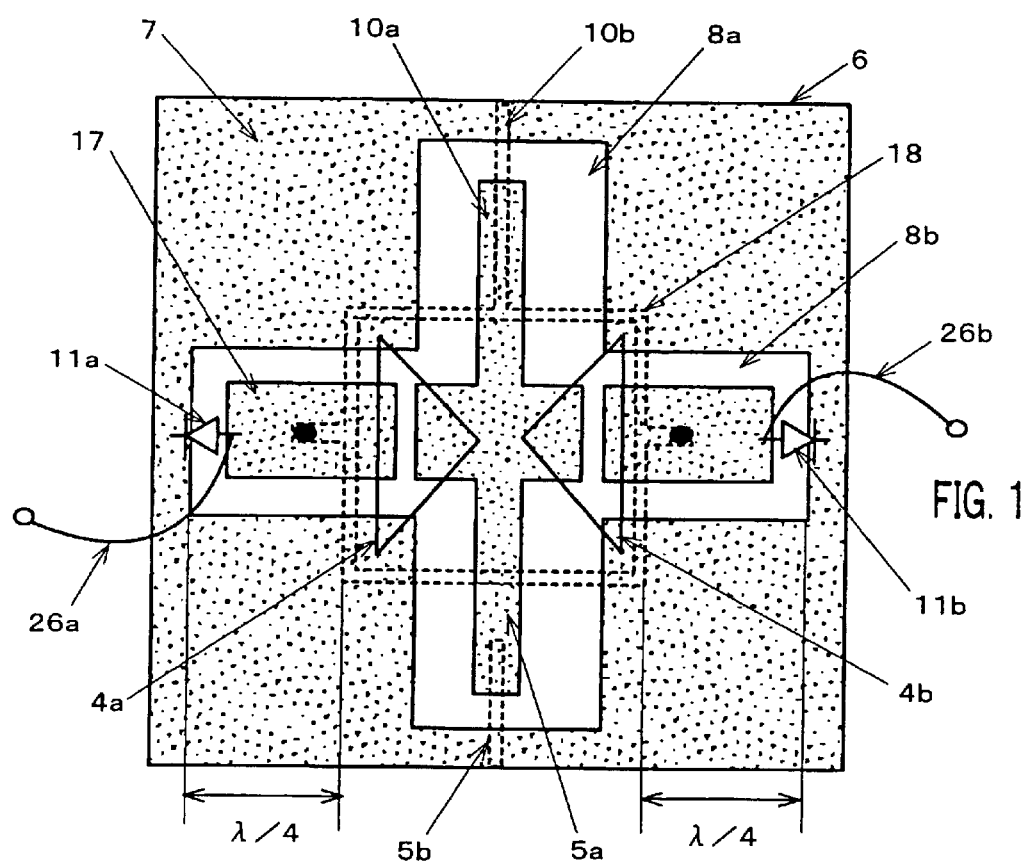
FIGS. 18 and 19 are schematic top plan views illustrating other examples of the second harmonics oscillator according to the ninth embodiment, respectively.

FIG. 18 illustrates a frequency variable version of the oscillator in FIG. 15. In the circuit illustrated in FIG. 15, the left end and right end of signal line 17 are both connected directly to surrounding metal conductor 7, whereas the circuit illustrated in FIG. 18 includes voltage variable capacitance element 19a connected between the left end of signal line 17 and surrounding metal conductor 7 such that the cathode of voltage variable capacitance element 19a is located close to metal conductor 7, and voltage variable capacitance element 19a likewise connected between the right end of signal line 17 and surrounding metal conductor 7 such that the cathode of voltage variable capacitance element 19b is located close to metal conductor 7. Both voltage variable capacitance elements 19a, 19b are disposed on the first main plane of substrate 6. Lead wires 26a, 27b are connected to anodes of voltage variable capacitance elements 19a, 19b, respectively, each for applying a control voltage. Likewise, in this circuit, voltage variable capacitance elements 11a, 11b are inserted in parallel to respective oscillation closed loops. It is therefore possible to vary the oscillation frequencies of fundamental wave $f_0$ and second harmonic wave $2f_0$ by applying the control voltage, for example, to one voltage variable capacitance element 19b such that the negative polarity is presented at the anode.

Figure 19:
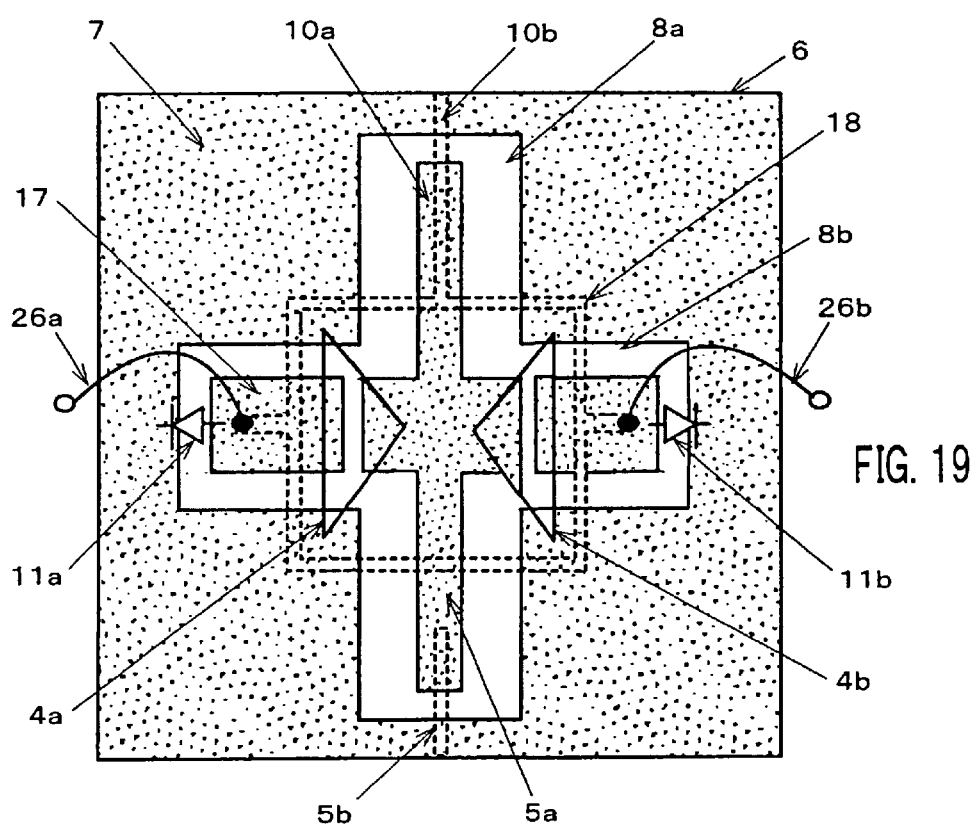

In the oscillator illustrated in FIG. 18, the length of second slot line 8b from the position traversed by micro-strip line 18 to the end is chosen to be $\lambda/4$ to realize a low impedance circuit, so that voltage variable capacitance elements 11a, 11b preferably have large capacitances. Alternatively, when the length of second slot line 8b from the position traversed by micro-strip line 18 to the end is reduced to less than $\lambda/4$, as illustrated in FIG. 19, to realize a high impedance circuit, voltage variable capacitance elements 11a, 11b preferably have small capacitances.

Next, description will be made on a frequency variable second harmonics oscillator according to a tenth embodiment of the present invention. Instead of the voltage variable capacitance elements disposed in second slot line 8b in the oscillator of the ninth embodiment, the oscillator of the tenth embodiment has voltage variable capacitance elements such as variable capacitance diodes in first slot line 8a.

Figure 20:
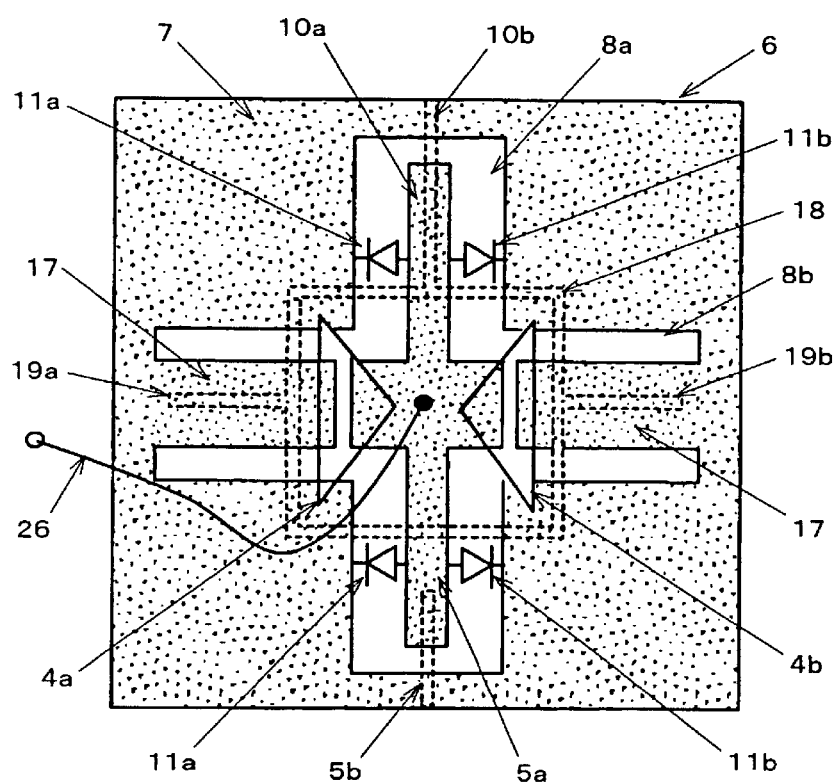
FIG. 20 is a schematic top plan view illustrating a second harmonics wave oscillator according to a tenth embodiment of the present invention.

Specifically, the oscillator according to the tenth embodiment illustrated in FIG. 20 adds to the oscillator illustrated in FIG. 14, a pair of voltage variable capacitance elements 11a, 11b disposed between output line 5a and metal conductor 7 on both sides thereof, and another pair of voltage variable capacitance elements 11a, 11b between injection line 10a and metal conductor 7 on both sides thereof. These voltage variable capacitance elements 11a, 11b are connected at positions corresponding to the outside of micro-strip line 18 on the first main plane of substrate 6 such that their cathodes are located close to metal conductor 7.

In the foregoing oscillator, the voltage variable capacitance elements are inserted in series with respective oscillation closed loops formed in an upper left portion, an upper right portion, a lower left portion, and a lower right portion on substrate 6 as illustrated in FIG. 20, as is the case with the oscillator illustrated in FIG. 6. It is therefore possible to vary the oscillation frequencies of fundamental wave $f_0$ and second harmonic wave $2f_0$ by applying a negative control voltage to the midpoint of signal line 17 through lead wire 26.

Figure 21:
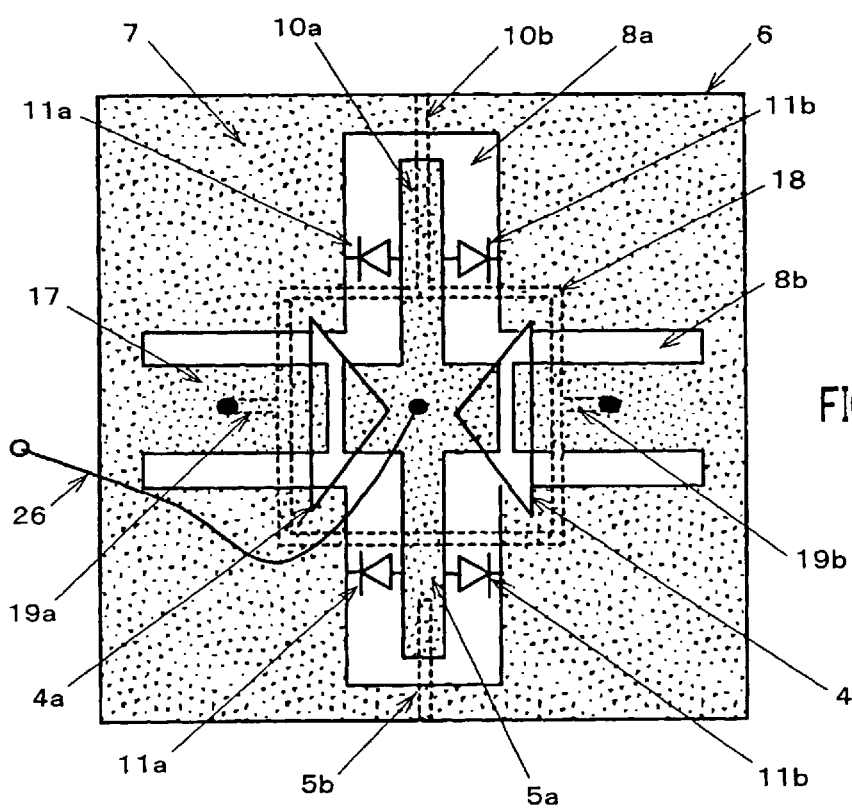
FIGS. 21 and 22 are schematic top plan views illustrating other examples of the second harmonics oscillator according to the tenth embodiment, respectively.
Figure 22:
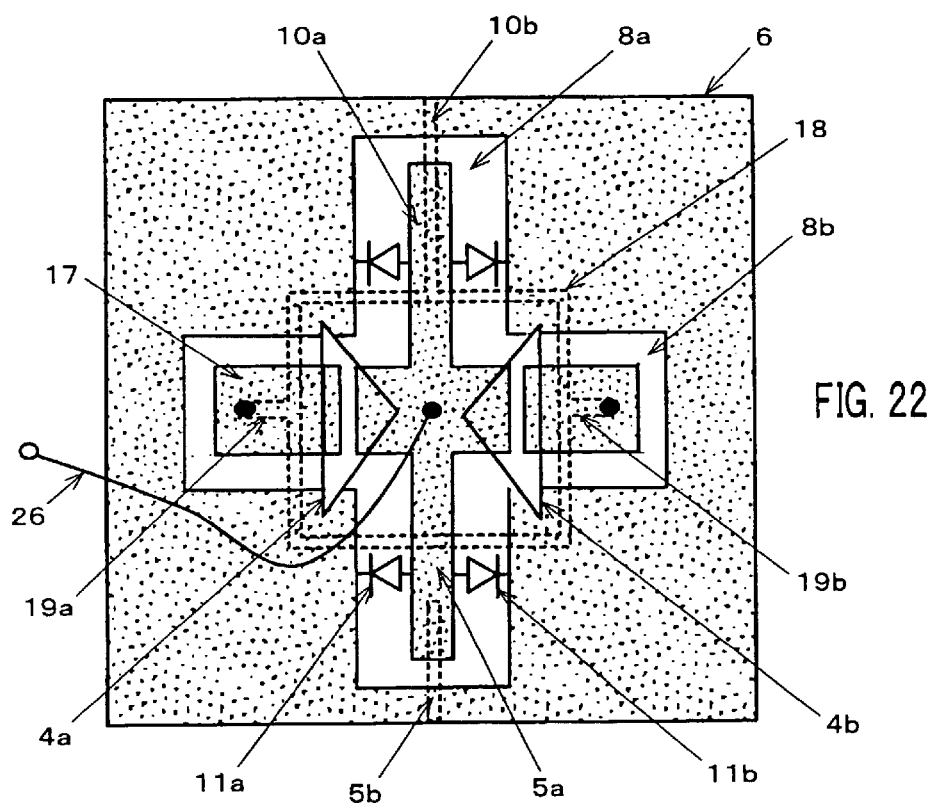

In the circuit illustrated in FIG. 20, lines 19a, 19b connected to micro-strip line 18 are implemented by micro-strip lines each having a length of $\lambda/4$. Alternatively, for example, as illustrated in FIG. 21, lines 19a, 19b may be reduced in length, and instead connected to signal line 17 through via-holes. In this case, as illustrated in FIG. 21, when signal line 17 is reduced in length and opened at both ends, a high impedance circuit can be designed. In the circuit illustrated in FIG. 21, second slot line 2b is also reduced in length commensurate with the reduced length of signal line 17.

While various preferred embodiments of the present invention have been described, a high frequency oscillator based on a so-called MMIC (monolithic microwave integrated circuit) can be readily created according to the present invention because the invention employs a plane circuit configuration. Especially, the invention is suitable for an uniplaner MMIC using a coplanar line and a slot line, further for multilayered three dimensional MMIC which is expected to have an ultra-small size.

What is claimed is:

1. A high frequency oscillator for combining outputs of two oscillators to generate an oscillation output, comprising:
    a substrate;
    a slot line formed on a first main plane of said substrate and having both longitudinal ends, said both longitudinal ends being electrically short-circuited;
    a first and a second amplifier for oscillation each disposed on one and the other side of said slot line, respectively, said amplifiers having outputs of a same oscillation frequency; and
    an unbalanced transmission line for connecting input terminals of said first and second amplifiers to each other and for connecting output terminals of said first and second amplifiers to each other, said unbalanced transmission line traversing said slot line and forming a closed loop including said first and second amplifiers.

2. The high frequency oscillator according to claim 1, wherein said unbalanced transmission line comprises a micro-strip line routed on a second main plane of said substrate.

3. The high frequency oscillator according to claim 1, wherein said unbalanced transmission line comprises a coplanar line routed on said first main plane.

4. The high frequency oscillator according to claim 1, wherein said unbalanced transmission line comprises:
   a first and a second coplanar line routed on the first main plane and connected to the input terminals of said first and second amplifiers, respectively;
   a micro-strip line routed on a second main plane of said substrate and connected to said first and second coplanar lines; and
   a conductor for connecting the output terminals of said first and second amplifiers to each other.

5. The high frequency oscillator according to claim 4, further comprising via-holes for connecting said first and second coplanar line to said micro-strip line therethrough.

6. The high frequency oscillator according to claim 4, wherein said first and second coplanar lines overlap said micro-strip line by a length equal to one quarter of a wavelength of a fundamental wave of oscillation, so that said first and second coplanar lines are electro-magnetically coupled to said micro-strip line.

7. The high frequency oscillator according to claim 1, further comprising a voltage variable capacitance element disposed within said slot line, wherein said high frequency oscillator varies the oscillation frequency in accordance with a control voltage applied to said voltage variable capacitance element.

8. The high frequency oscillator according to claim 1, wherein said unbalanced transmission line comprises:
   a coplanar line routed on the first main plane to intersect said slot line, said coplanar line having a first portion connected to the input terminal of said first amplifier, a second portion for connecting the output terminals of said first and second amplifiers, and a third portion connected to the input terminal of said second amplifier;
   a micro-strip line formed on a second main plane of said substrate in a loop shape to surround a region in which said slot line intersects said coplanar line and said first and second amplifiers are disposed; and
   a first and a second line connected to said micro-strip line corresponding to said first and third portions on the second main plane.

9. The high frequency oscillator according to claim 8, wherein said coplanar line are formed with both ends short-circuited to a ground conductor.

10. The high frequency oscillator according to claim 8, wherein said coplanar line has both ends formed as open ends.

11. The high frequency oscillator according to claim 8, wherein each of said first and second lines each has a micro-strip line structure which has a length equal to one quarter of a wavelength of a fundamental wave of oscillation.

12. The high frequency oscillator according to claim 8, wherein said first and second lines are connected to said first portion and said third portion, respectively, through via-holes.

13. The high frequency oscillator according to claim 8, further comprising a voltage variable capacitance element disposed within said slot line, wherein said high frequency oscillator varies the oscillation frequency in accordance with a control voltage applied to said voltage variable capacitance element.

14. The high frequency oscillator according to claim 8, further comprising a voltage variable capacitance element connected to said coplanar line, wherein said high frequency oscillator varies the oscillation frequency in accordance with a control voltage applied to said voltage variable capacitance element.

15. The high frequency oscillator according to claim 8, further comprising a voltage variable capacitance element connected to said micro-strip line, wherein said high frequency oscillator varies the oscillation frequency in accordance with a control voltage applied to said voltage variable capacitance element.

16. The high frequency oscillator according to claim 1, wherein said unbalanced transmission line traversing at one longitudinal end side and the other longitudinal end side of said slot line is spaced apart from the one longitudinal end and the other longitudinal end of said slot line respectively by an interval equal to one quarter of a wavelength of a fundamental wave of oscillation.

17. The high frequency oscillator according to claim 1, further comprising an output line connected to a portion of said unbalanced transmission line which connects the output terminals of said first and second amplifiers to each other, said output line extending within said slot line, wherein said high frequency oscillator generates an output at a frequency twice as high as a frequency of a fundamental wave of oscillation through said output line.

18. The high frequency oscillator according to claim 17, wherein:
   said unbalanced transmission line includes a micro-strip line routed on a second main plane of said substrate; and
   said output line is routed on the second main plane for connection to said micro-strip line, said output line having a micro-strip line structure.

19. The high frequency oscillator according to claim 17, wherein said output line comprises a band pass filter for passing a frequency twice as high as the frequency of the fundamental wave of oscillation.

20. The high frequency oscillator according to claim 19, wherein said band pass filter has a line length equal to one eighth of the wavelength of the fundamental wave.

21. The high frequency oscillator according to claim 1, wherein:
   said unbalanced transmission line includes a coplanar line or a conductor routed on the first main plane for connecting the output terminals of said first and second amplifiers to each other,
   said high frequency oscillator further comprises:
      a first output line in a coplanar line structure, routed on the first main plane and connected to said coplanar line or conductor to extend within said slot line; and
      a second output line in a micro-strip line structure, routed on a second main plane of said substrate and electrically coupled to said first output line, and
      said high frequency oscillator generates an output at a frequency twice as high as the frequency of a fundamental wave of oscillation through said first and second output lines.

22. The high frequency oscillator according to claim 1, further comprising an injection line for injection synchronization connected to a portion of said unbalanced transmission line which connects the input terminals of said first and second amplifiers, and extending within said slot line.

23. The high frequency oscillator according to claim 22, wherein:
   said unbalanced transmission line includes a micro-strip line routed on a second main plane of said substrate, and said injection line is routed on the second main plane for connection to said micro-strip line, said injection line having a micro-strip line structure.

24. The high frequency oscillator according to claim 1, wherein:

said unbalanced transmission line includes a coplanar line routed on the first main plane for connecting the input terminals of said first and second amplifiers to each other, and said high frequency oscillator further comprises:

a first injection line in a coplanar line structure, routed on the first main plane for connection with said coplanar line or conductor to extend within said slot line; and a second injection line in a micro-strip line structure, routed on a second main plane of said substrate, and electro-magnetically coupled to said first injection line, wherein a synchronization signal is injected into said closed loop through said first and second injection lines.

25. The high frequency oscillator according to claim 1, further comprising an output line routed in parallel with a portion of said unbalanced transmission line which connects the output terminals of said first and second amplifiers, and traversing said slot line, wherein said high frequency oscillator delivers a fundamental wave component of the oscillation through said output line.

* * * * *